(12) United States Patent
Bonaccio et al.

(10) Patent No.: US 9,698,968 B2
(45) Date of Patent: *Jul. 4, 2017

(54) PHASE INTERPOLATOR CALIBRATION

(71) Applicant: International Business Machines Corporation, Armonk, NY (US)

(72) Inventors: Anthony R. Bonaccio, Shelburne, VT (US); Timothy C. Buchholtz, Rochester, MN (US); Rajesh Cheeranthodi, Kerala (IN); Giri N. Rangan, Giri (IN); Sergey V. Rylov, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/058,625

(22) Filed: Mar. 2, 2016

(65) Prior Publication Data

US 2016/0182216 A1 Jun. 23, 2016

Related U.S. Application Data

(63) Continuation of application No. 14/154,203, filed on Jan. 14, 2014, now Pat. No. 9,306,729.

(51) Int. Cl.
| | |
|---|---|
| *H03D 3/24* | (2006.01) |
| *H04L 7/00* | (2006.01) |
| *H04L 7/033* | (2006.01) |
| *H03L 7/081* | (2006.01) |
| *H04L 27/34* | (2006.01) |

(52) U.S. Cl.
CPC .......... *H04L 7/0029* (2013.01); *H03L 7/0814* (2013.01); *H04L 7/0079* (2013.01); *H04L 7/0332* (2013.01); *H04L 27/3405* (2013.01)

(58) Field of Classification Search
CPC . H04L 7/0029; H04L 7/0332; H04L 27/3405; H03L 7/0814
USPC ................................ 375/374, 354, 371, 373
See application file for complete search history.

(56) References Cited

U.S. PATENT DOCUMENTS

| | | | |
|---|---|---|---|
| 7,532,053 | B2 | 5/2009 | Rausch |
| 7,772,898 | B2 | 8/2010 | Cheung |
| 7,817,767 | B2 | 10/2010 | Tell et al. |
| 7,873,132 | B2 | 1/2011 | Desai |
| 2003/0123594 | A1 | 7/2003 | Glenn et al. |
| 2003/0224747 | A1 | 12/2003 | Anand |

(Continued)

*Primary Examiner* — Helene Tayong
(74) *Attorney, Agent, or Firm* — Scully, Scott, Murphy & Presser, P.C.; Steven Meyers, Esq.

(57) ABSTRACT

System, method and computer program product for setting phase control codes to (in-phase) I and (quadrature) Q rotators to a first code pair, different by enough to produce a phase difference between the rotator outputs sufficient to be detected with minimal error by a phase-to-voltage converter. Auxiliary trim DACs are then adjusted according to calibration logic until a comparator output detects a phase difference between the I and Q rotators are within tolerable limits. The resulting trim codes are stored for both the codes in the pair. These trim codes along with the main codes are subsequently applied whenever the codes are used thereafter. These steps are repeated with each successive code pair having the same separation as the first code pair, e.g. both incremented by same amount until all codes have been calibrated. In this manner having the phase separation between all code pairs forced to the same value.

22 Claims, 12 Drawing Sheets

(56) References Cited

U.S. PATENT DOCUMENTS

| | | |
|---|---|---|
| 2004/0170244 A1 | 9/2004 | Cranford, Jr. et al. |
| 2010/0073048 A1 | 3/2010 | Ke et al. |
| 2013/0002290 A1 | 1/2013 | Gondi et al. |
| 2013/0063193 A1 | 3/2013 | Zhang |

PHASE INTERPOLATOR CALIBRATION

BACKGROUND

This disclosure relates generally to very high data-rate communication systems, e.g., employing a receiver for high speed digital communications signals and a phase interpolator, and more particularly to a novel phase interpolation calibration technique employing linear phase interpolator architecture.

Phase Interplolators, also referred to as Phase Rotators, are an integral part of a clock-data recovery (CDR) module in a very high data-rate communication system, e.g., like Serial Deserial or "SerDes" links. A Phase Interplolator generates finely phase shifted versions of the data sampling clock, which are further utilized to sample the data at an optimal point. Different implementation techniques of phase interpolation exist. Some are based on Delay locked loops, and others are based on the linear interpolation between two phases (typically In-phase and Quadrature-phase) of the reference clock.

A Phase Interpolator implementations based on the linear interpolation between two phases (typically In-phase and Quadrature-phase) of the reference clock are open loop systems that produce the desired phase-shifted output by controlling the bias current steered to the I and Q summing amplifiers. One important parameter of interest is the Integrated Non-linearity (INL) of the phase positions at the output of the phase interpolator with respect to the input digital codes. The INL performance is of importance as it decides how accurately and efficiently the CDR loop can lock to the correct sampling point on the received data eye-diagram. Being an open loop system, the INL of the phase interpolator is affected by various circuit and design parameters.

As the INL is affected by so many design parameters, and any adjustments of these parameters in order to get reasonable INL performance require significant design efforts with area/power penalty, it would be highly desirable to provide a closed loop calibration system to measure and correct for the INL errors.

SUMMARY

A system and method to calibrate a phase interpolator against INL errors.

A system and method to calibrate any phase interpolator implementation including employing a phase measurement apparatus.

A system and method for performing a pre-offset calibration of the phase measurement apparatus for removing any offset errors in the phase measurement apparatus which can potentially degrade the calibration effectiveness.

A closed loop calibration system and method to measure and correct for the Integrated Non-linearity (INL) errors in a simple and efficient manner.

Thus, in one aspect, there is provided a calibration apparatus for a phase interpolator (PI), the interpolator having: a first current mixer and a second current mixer, the first mixer generating a first clock signal of a first phase according to bias currents applied to the first mixer according to a received first digital code value, and the second mixer generating a second clock signal of a second phase offset from the first phase according to a received second digital code value, the apparatus comprising: a phase detector for receiving the first and second clock signal and generating a difference signal according to a detected phase error difference; a charge pump integrator circuit for receiving the difference signal and generating an output voltage ramp signal having a slope proportional to the detected phase error difference; and a comparator device receiving the output ramp signal and comparing output voltage ramp signal against a predetermined threshold, the comparator generating an output signal responsive to the comparison, the output signal representing a direction for adjustment of either the first clock phase or the second offset clock phase, or both to correct a detected phase error; and a logic circuit receiving the output signal and applying logic for determining a first calibration code value for adjusting a first bias current applied to the first mixer, and/or determining a second calibration code value for adjusting a second bias current applied to the second mixer to achieve a desired phase offset between the first and second clock signals.

A method of calibrating a phase interpolator (PI), the PI having a first current mixer and a second current mixer, the first mixer generating a first clock signal of a first phase according to a received first digital code value, and the second mixer generating a second clock signal of a second phase offset from said first phase according to a received second digital code value, said method comprising: detecting, at a phase detector, a phase error difference between said first and second clock signals; generating a difference signal according to said detected phase error difference; generating, at a charge pump integrator circuit, an output ramp signal having a slope proportional to said detected phase error difference; comparing, at a comparator device, said output ramp signal against a predetermined threshold, and generating an output signal responsive to said comparison, said output signal representing a direction for adjustment of either said first clock phase or said second offset clock phase, or both; determining, at a logic circuit, a first calibration code value for adjusting a first bias current applied to said first mixer, and determining a second calibration code value for adjusting a second bias current applied to said second mixer; and applying said adjusting first bias current and adjusting second bias current to said respective first mixer and second mixer to achieve a desired phase offset between said first and second clock signals.

BRIEF DESCRIPTION OF THE DRAWINGS

These and other objects, features and advantages of the present invention will become apparent from the following detailed description of illustrative embodiments thereof, which is to be read in connection with the accompanying drawings, in which.

DETAILED DESCRIPTION

This disclosure presents a calibration scheme for a high speed Digital-to-Phase linear interpolator for calibration of very high frequency clocks (e.g., of the order of several GHz). The calibration procedure described in this disclosure provides both methods and circuit implementations suited for Phase Interpolators at very high frequencies.

A linear phase interpolator architecture of an exemplary embodiment is used to describe the calibration method disclosed here. It is understood that the calibration technique described herein can be applied to any phase interpolator operable based on the linear interpolation between two phases (typically In-phase and Quadrature-phase) of the reference clock based implementations.

A method for calibrating the Phase Interpolator against INL errors is presented along with the required hardware (circuit) implementation. A novel method for self calibration of the calibration hardware is also presented which can be used to measure and cancel any offset errors existing in the calibration apparatus.

Figure 1:
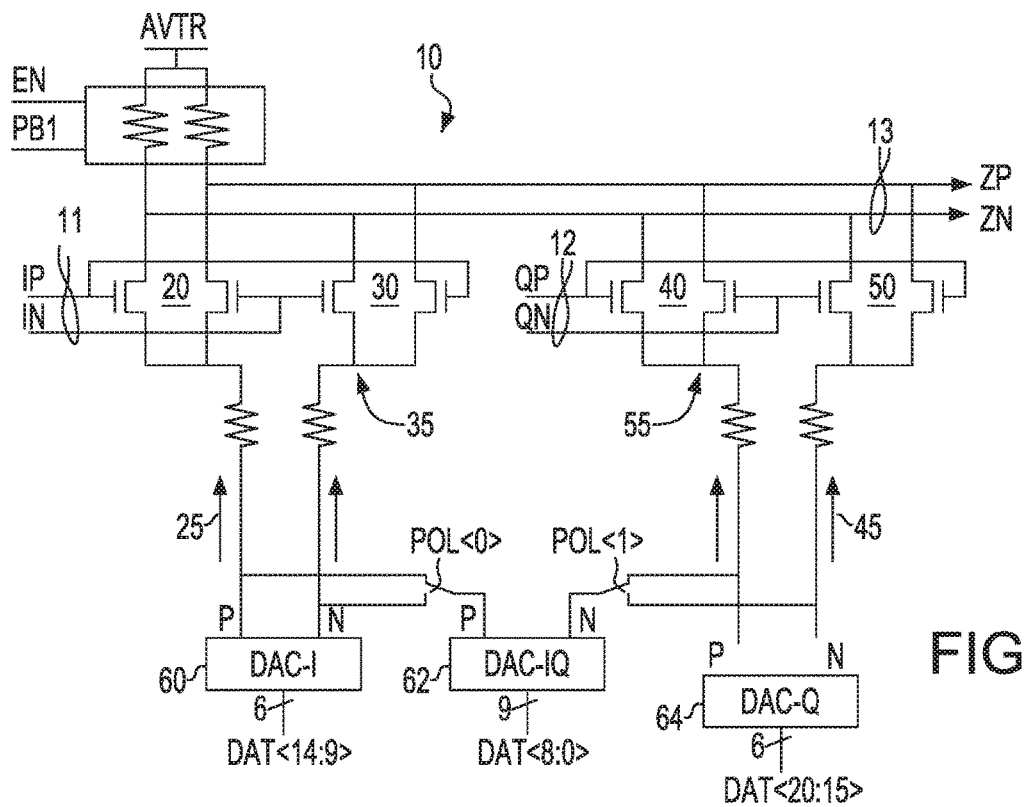
FIG. 1 shows a basic structure of linear I-Q phase interpolator in one embodiment.

FIG. 1 shows a structure of a single instance of an example linear I-Q Phase Interpolator 10.

The architecture of the single instance of a phase interpolator 10 of FIG. 1 includes current-mode summing amplifiers, e.g., summing amplifiers 20 and 30 forming summing node 35 for receiving respective IP and IN clocks, and summing amplifiers 40, 50 forming summing node 55 for receiving the QP and QN clocks. Each summing node 35, 55 is configured to add the respective I (in-phase) and Q (quadrature) phases onto an output node which carry output phase adjusted differential clock signals ZP, ZN 13.

It is understood that a conventional Clock Data Recovery circuit (CDR) requires two I-Q Phase Interpolator instances, one each for DATA sampling clocks and EDGE sampling clocks. Thus, the method and calibration system of the embodiments described herein is conducted using two such interpolators as described herein below with respect to FIG. 3. That is, in view of FIG. 3, the single PI instance of the circuit 10 of FIG. 1 may comprise a first mixer circuit 36 for a CDR, e.g., for the data sampling clocks. A second PI instance of the circuit 10 of FIG. 1 may comprise a second mixer circuit 56 for a CDR, e.g., for the edge sampling clocks.

More particularly, for a single PI circuit instance 10 of FIG. 1, a set of current steering DACs 60, 62, 64 are respectively implemented to effectively control the bias currents steered to I and Q summing node amplifiers. That is, a DAC 60, 64 are respectively implemented to adjust the strengths of the I and Q summing nodes 35, 55 separately: i.e., a current steering DAC 60 is provided to adjust the strengths of the I amplifiers 20, 30 of summing node 35; and a current steering DAC 64 is provided to adjust the strengths of the Q amplifiers 40, 50 of summing node 55 separately, so as to produce the required phase shifted output signals 13 after their summation. It is understood that when the I DAC 60 and Q DAC 64 steers current to respective I paths and Q paths respectively, the IQ DAC 62 steers the current from I path to Q path and vise versa. Thus by actuating IQ DAC 62 one can reduce the I current and increase the Q current simultaneously. In FIG. 1, the phase position of the output clock signals ZP, ZN 13 can thus be controlled using the digital codes received at the DACs 60, 62, 64. The phase interpolator 10 of FIG. 1 has an advantage over the DLL based (phase interpolator) counterparts in the sense that only the phase with the required phase shift is produced at any given point of time.

Figure 2:
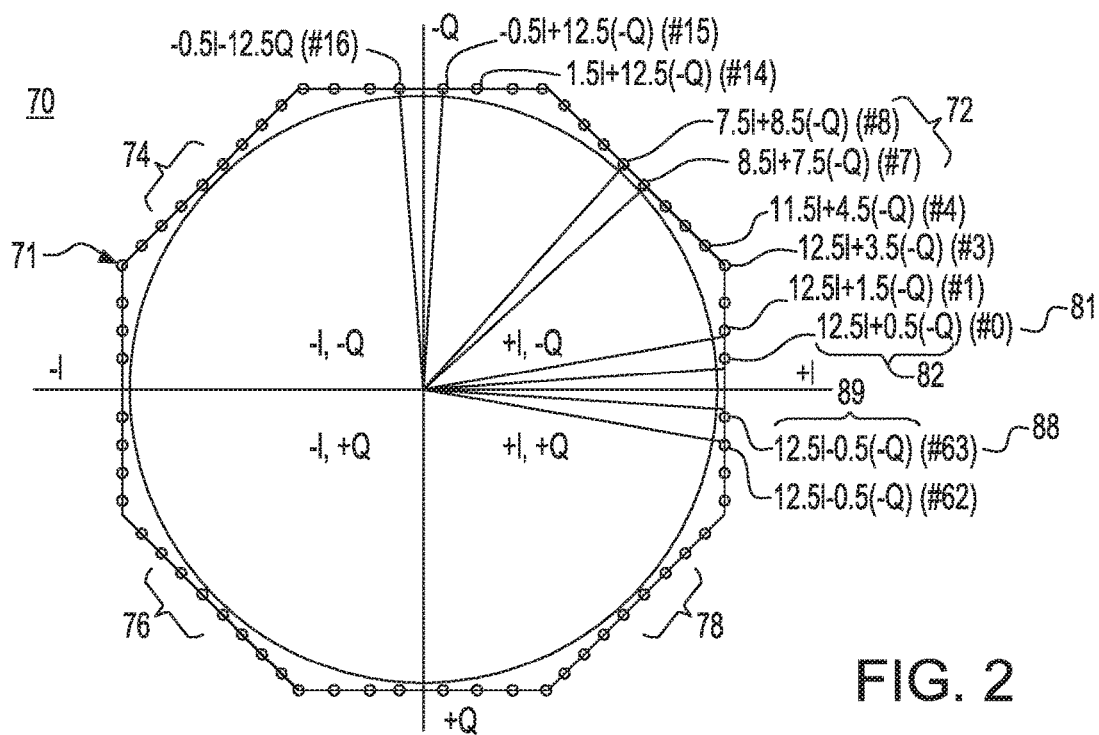
FIG. 2 shows a phase constellation for a 64 position phase interpolator.

In one non-limiting embodiment, the example linear I-Q Phase Interpolator described herein below with respect to FIG. 3 to be calibrated is configurable to generate 64 equally spaced phase positions of the input clock by weighed linear additions of the In-phase (I) and Quadrature-phase (Q) input signal components of the input clock. FIG. 2 shows an octogonal phase interpolator constellation 70 for a 64-position phase interpolator showing the different programmable phase positions 71 of an input clock signal that range between a first phase position 81 and a $63^{rd}$ phase position 88. More particularly, the linear I-Q Phase Interpolator 10 to be calibrated is configurable to generate 64 equally spaced phase positions, each phase position achievable by weighed linear additions of the In-phase (I) clocks IP and IN representing each in-phase signal of a differential clock signal pair 11 and weighted linear additions of the Quadrature-phase (Q) of the input clocks QP and QN representing each quadrature-phase signal of a differential clock signal pair 12 as programmed via (digital to analog) DAC converters 60, 62, 64 as shown in FIG. 1.

For example, as shown in FIG. 2, a first clock phase position 81 is achieved based on a weighted combination of quadrature (positive or negative) and in-phase (positive or negative) input signal components 82 while a $63^{rd}$ clock phase position 88 (FIG. 2) is achieved based on a weighted combination of quadrature (positive or negative) and in-phase (positive or negative) input signal components 89. With reference to FIG. 1, in an example implementation, when the IQ DAC 62 code is incremented by a least significant bit (LSB), for example, I path current increases by an LSB, and Q path current decreases by an LSB. A realization of incrementing the IQ DAC code by a least significant bit (LSB) such that I path current increases by an LSB and Q path current decreases by an LSB is represented at portions 72, 74, 76, 78 on the octagonal phase interpolator constellation of FIG. 2.

In an example 64 phase constellation implementation, the 64-point Phase Interpolator operates at a frequency of about 7.5 GHz resulting in a Phase Difference between two successive codes to be about 2.0 ps. The measurement of phase errors thus becomes difficult if the delay between two input signals to the phase detector becomes small. Moreover, any random jitter present in the clock may affect the phase error measurement.

Figure 3:
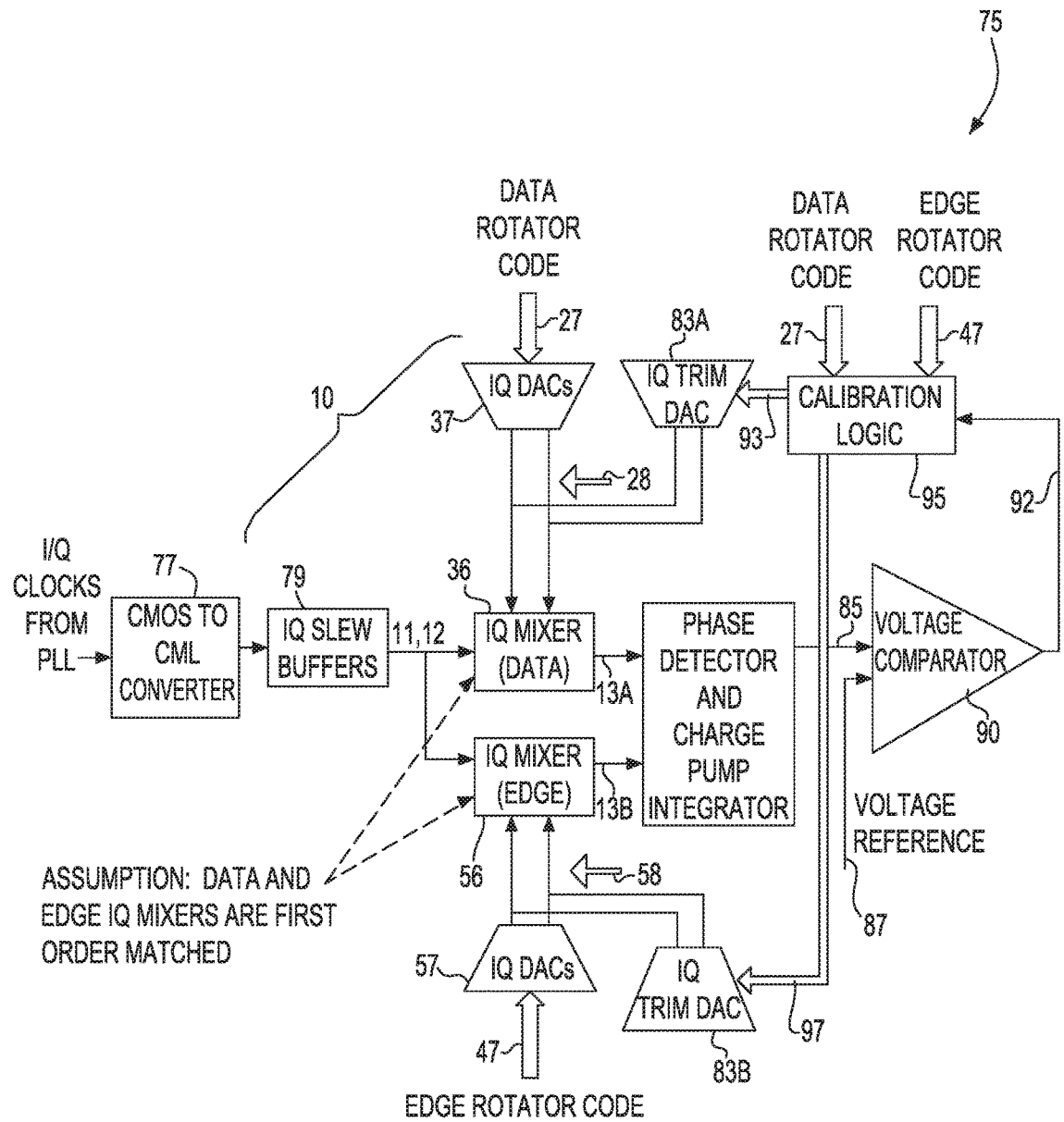
FIG. 3 shows a calibration hardware-block diagram 75 for calibrating a linear I-Q phase interpolator in one embodiment.

FIG. 3 is a block diagram depicting one embodiment of the calibration hardware-block architecture 75 for a phase interpolator 10' (having features as the phase interpolator 10 of FIG. 1). In the embodiment of the phase interpolator calibration hardware 10' shown in FIG. 3, two (2) phase interpolator instances are implemented.

Particularly, the calibration hardware architecture is a closed loop calibration system 75 for the two phase interpolator instances depicted in the phase interpolator 10'.

In the embodiment depicted, the PI 10' is shown as part of a high speed digital receiver circuit having components such as: a CMOS to current-mode logic (CML) converter 77 that receives respective in-phase and quadrature clocks e.g., from the PLL of a clock recovery circuit (not shown). The respective CML converter I/Q clock outputs are input to respective I/Q slew buffers 79 for satisfying any slew constraints. In the embodiment of FIG. 3, respective In-phase (I) differential input clock signals 11 and Quadrature-phase (Q) differential input clock signals 12 are each received as input at each of two phase interpolator instances present in a CDR module (not shown): one for the Data sampling clock 11 and other for the Edge sampling clock 12. These clocks are input to each of: a first I/Q Mixer such as a Data I/Q Mixer 36 and a second I/Q Mixer such as an Edge I/Q Mixer 56. In one embodiment, Data I/Q Mixer 36 and Edge I/Q Mixer 56 are $1^{st}$ order matched. Each respective data I/Q mixer 36 and edge I/Q mixer 56 may be embodied as summing amplifier circuits. For example, in a non-limiting embodiment, data I/Q mixer 36 may employ amplifier circuitry 20, 30 such as in the corresponding mixer circuit 35 of FIG. 1); while further, in a non-limiting embodiment, edge I/Q mixer 56 may employ amplifier circuitry 40, 50 circuitry such as in the corresponding mixer circuits 55 of FIG. 1). Thus, as shown in FIG. 2, in a non-limiting embodiment, data I/Q mixer 36 is responsive to programmed digital codes, i.e., Data Rotator Codes 27 received at a I/Q digital to analog converter (DAC) 37 (which may correspond to DAC 60 of FIG. 1) to provide a phase-adjusted data sampling signal 13A; likewise, in FIG. 2, in a non-limiting embodiment, edge I/Q mixer 56 is responsive to programmed digital codes, i.e., Edge Rotator Codes 47 received at a digital to analog converter DAC 57 (which may correspond to DAC 62 of FIG. 1) to provide a phase-adjusted edge sampling signal 13B.

As the Phase Interpolator 10 of FIG. 1 (and PI 10' of FIG. 2) is an open loop system, it produces the desired phase-shifted output signals 13 by controlling respective I/Q bias currents 25 and 45 steered to the respective I and Q summing amplifiers (i.e., input to mixers 35, 55) through the I, Q and IQ current steering DACs. One important parameter of interest is the Integrated Non-linearity (INL) of the phase positions at the output of the phase interpolator with respect to the input digital codes. The INL performance is of importance as it decides how accurately and efficiently a Clock Data Recovery (CDR) loop (not shown) can lock to the correct sampling point on the received data eye-diagram. Being an open loop system, the INL of the phase interpolator 10 is affected by various circuit and design parameters such as:

the mismatch between current sources within the I/Q/IQ DACs (60, 62, 64, etc.)

the IQ separation error at Phase Interpolator (Mixer) input the I and Q clocks amplitude mismatch the wide range of bias currents handled by the I and Q Mixer stages. For example, the devices may operate in different operating regions, and will obey different I-to-Gm equations; and the non-ideal clock waveforms (IQ Mixer works best with cosine-waves) going into IQ Mixer.

Additionally, clipping and slewing at any stage in the signal chain is found to affect the INL performance.

The closed loop calibration system 75 is configured to measure and correct for the INL errors for the phase interpolator 10.

Particularly, as shown in FIG. 3, the calibration circuit architecture ("hardware") 75 provides a closed loop calibration system for any phase interpolator implementation such as the 64 position phase interpolator 10', and implements a method for calibrating the phase interpolator. As will be further described, the hardware circuit 75 is configurable to implement a method for self-calibration of the calibration hardware 75 which can be used to measure and cancel any offset errors existing in the calibration apparatus.

The calibration system 75 is configured to measure, using a phase detector block 80, the phase difference between two selected phase position pairs (rotator code pairs) and then correct for any errors by fine adjustments through IQ Trim DACs 83A, 83B, where trim DAC 83A adjusts bias current to the Data sampling phase interpolated clock 13A and trim DAC 83B adjusts bias current to the Edge sampling Phase Interpolator clock 13B. The resulting correction codes for the two code pairs that underwent calibration are stored—such as in a table in a memory storage device, which may be implemented within the integrated circuit, and recalled whenever these codes are used. This calibration procedure is performed for all the codes in the rotator.

Particularly, phase detector block 80 detects and measures the phase difference between two phase positions of the Phase Interpolator at its output. The phase positions are detected from the respective system adjusted clock signals 13A output from the Data I/Q Mixer 36 and adjusted clock signals 13B output from the Edge I/Q Mixer 56 of the phase interpolator 10.

A phase error difference between input and quadrature phase clock signals is detected at the phase detector block 80 and the Phase detector block 80 employs a phase-to-voltage converter (not shown) to generate a phase error difference signal 85 at the output of phase detector block 80. This output phase error difference signal 85 is compared against a reference voltage signal 87 by voltage comparator circuit 90 to determine and generate a calibration offset signal 92. In one embodiment, the comparator circuit 90 of FIG. 3 may be a fully differential implementation with a differential reference input, i.e., a two threshold differential comparator circuit having two thresholds, an upper one and a lower one, that receives each of two (differential) signals output from the charge pump integrator 80. The comparison circuit 90 (FIG. 3 may also include two differential comparators working on two different voltage reference thresholds. This calibration offset signal 92 is input as feedback to a calibration logic circuit 95 that receives the programmed digital codes, i.e., Data Rotator Codes 27 and Edge Rotator Codes 47. Particularly, calibration logic circuit 95 is responsive to the received feedback error difference signal 92 to generate respective calibration trim codes that may be stored for later use, e.g., calibration or during PI operation. The calibration trim codes generated include code values 93 input to trim DAC 83A for providing an adjusting bias current 28 to the data I/Q mixer 36 for fine-tuned phase calibration adjusting of data sampling phase interpolated clock 13A, and code values 97 input to trim DAC 83B for providing an adjusting bias current 58 to the Edge I/Q Mixer 56 for fine-tuned phase calibration adjusting of phase Edge sampling Phase Interpolator clock 13B.

That is, trim DACs 83A, 83B are to be used in conjunction with respective main Data I/Q Mixer DAC 37 and Edge I/Q Mixer DAC 57 so that they share a portion of main DAC currents. This way, the original Phase Interpolator operating condition is replicated when all the Trim code values are set to zero. The Trim DACs 83A, 83B can be implemented as a thermometric DAC like the main Data I/Q DAC 37 and Edge I/Q DAC 57, and their individual current source strengths can be kept to a level (e.g., 10%) of that of the main Data I/Q DAC 37 and Edge I/Q DAC 57 current source strengths. In one embodiment, actuating Trim DACs 83A, 83B can change the phase position by 0.1 LSBs. The calibration logic controls the I and Q Trim DACs based on the main code that is being Trimmed, i.e., for certain codes only I Trim DAC is actuated, where as for certain other codes only Q Trim DAC is actuated. Both, the I and Q Trim DACs may be actuated for some other code values.

Figure 5A:
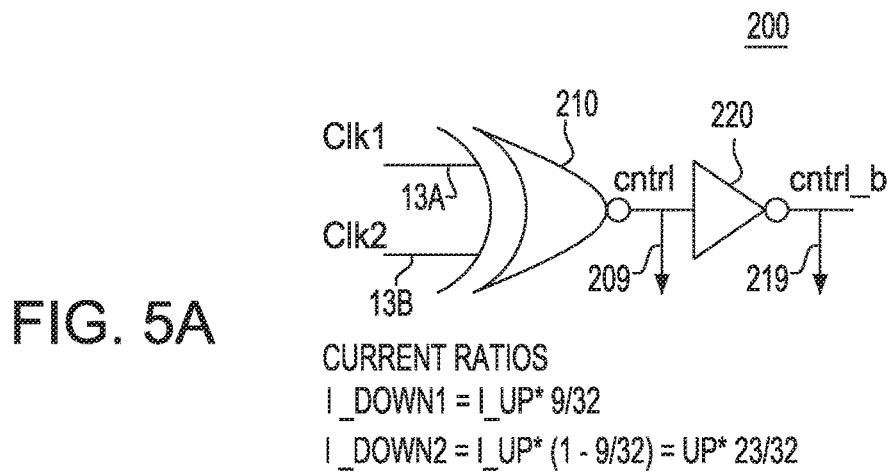
FIG. 5A shows a basic architecture of the phase detector 200 and FIG. 5B shows a basic architecture of charge pump integrator 250 in one embodiment.
Figure 5B:
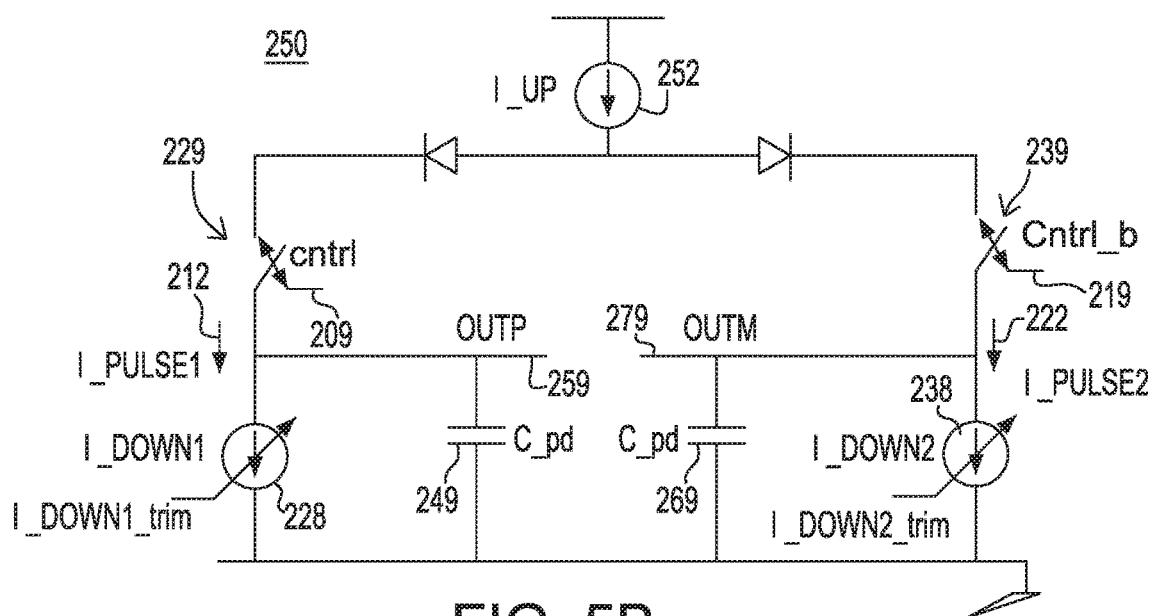

FIGS. 5A and 5B depict a respective circuit diagram implementation of a phase detector 200 and charge pump integrator circuit 250 of phase detector block 80 of FIG. 3. The Phase detector 200/charge pump integrator 250 elements and the comparator device 90 forms the phase error measurement system required for calibration. The charge-pump integrator 250 shown in FIG. 5B and the comparator 90 (of FIG. 3) particularly performs measurement and correction of the INL errors suitable for calibration of the high speed phase interpolators.

Figure 5C:
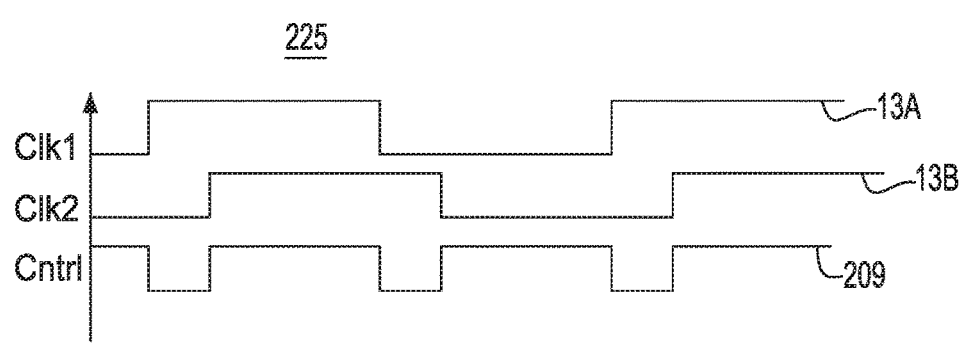
FIG. 5C shows an example timing diagram 225 depicting operation of the phase detector operation 200 of FIG. 5A.

In the embodiment depicted in FIG. 5A, the phase detector 200 functions as a phase-to-voltage converter and comprises an XOR gate 210 in series connection with an inverter or buffer gate 220. The XOR Phase detector (and charge pump) circuits may be implemented in 32 nm (Silicon on insulator) SOI process. The XOR gate 210 of phase detector 200 converts the input phase error between respective data I/Q mixer output sampling clock and edge I/Q mixer output sampling clock signal 13B to a proportionate output current represented in signals 209 and inverted signal 219. The XOR phase detector 200 shown in FIG. 5A receives the two clocks: clk1 13A and clk2 13B as depicted in the timing diagram 225 of FIG. 5C. These signals are first XORed by phase detector 200 to produce control (cntl) pulses 209 and output buffer control (cntl2) pulses 219 whose widths is proportional to the phase difference between the two input clocks. Referring to FIG. 5B, these pulses 209, 219 are used to operate respective control switches 229, 239 in the charge pump in charge pump integrator 250. The XOR output produces the phase difference pulses 209, 219 with good rise/fall delays.

The charge pump integrator circuit 250 includes a current source (I_UP) 252 that provides signal currents 212, 222 for the charge pump that builds charge along two branches in response to activation of respective semiconductor switches 229, 239. The charge pump integrator circuit 250 integrates these signal currents 212 and 222 so as to give a large gain to the phase errors and produces a voltage ramp at respective (differential) outputs OUT P 259, OUT M 279. For example, semiconductor switch 229 in a first branch will activate under cntl pulse 209 control to build charge on the capacitor C_pd 249 at output OUT P 259 proportional to the detected phase offset; likewise, semiconductor switch 239 in a second branch will activate under cntl pulse 219 control to build charge on the capacitor C_pd 269 at output OUT M 279 proportional to the detected phase offset. The large gain in the phase-to-voltage converter helps to suppress the effects of comparator offset and threshold variation. The diodes 261, 262 in each branch prevents the short circuit between OUTP 259 and OUTM 279 during the switch overlap time. The capacitors C_pd 249 at output OUT P 259 and C_pd 269 at output OUT M 279 further reduce the clock feed through at output.

In one embodiment, the charge pump produces a differential voltage output between nodes OUTP 259 and OUTM 279 which is proportional to the phase error between clk1 and clk2 from an ideal phase difference of 360*9/64 degrees. The charge pump's current source (I_UP) 252 is either connected to the OUTP node or OUTM node as per the state of 'cntrl' signals 209 or 219. The bottom current sources of the charge pump, i.e., current source 228 (I_DOWN1) in the first branch and current source 238 (I_DOWN2) in the second branch are maintained at the following ratios with respect to I_UP 252.

$$I\_DOWN1 = I\_UP * 9/32$$

$$I\_DOWN2 = I\_UP * (1-9/32) = I\_UP * 23/32$$

That is, in one embodiment depicted in FIG. 5B, nominal I_UP to I_DOWN1,IDOWN2 current ratios are maintained so as to detect the phase error from the ideal phase difference between the clocks for a code offset of 9. In one embodiment, the I_DOWN1 and IDOWN_2 current sources may be trimmed.

Figure 6A:
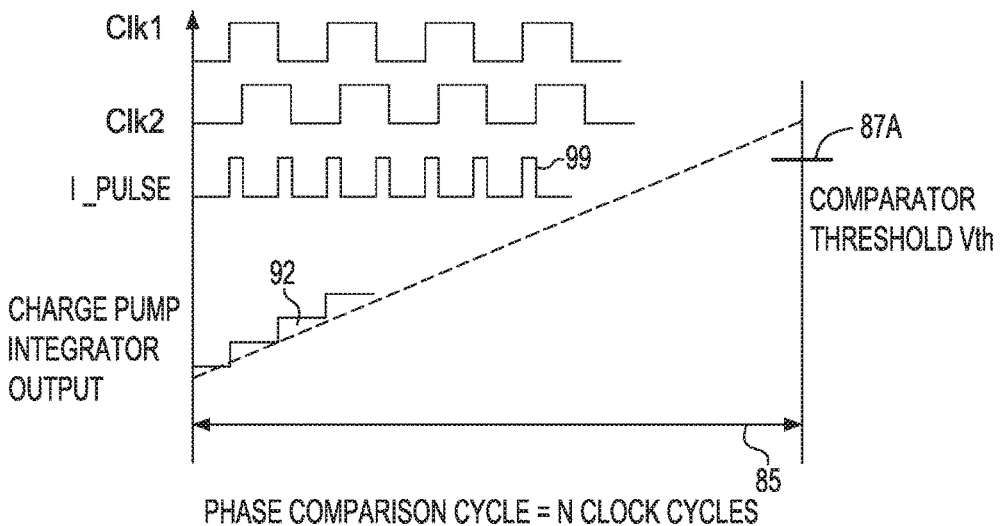
FIG. 6A shows the charge pump integrator 250 integrating many phase error pulses at the output of the phase detector/charge pump-integrator during a single phase comparison cycle.
Figure 6B:
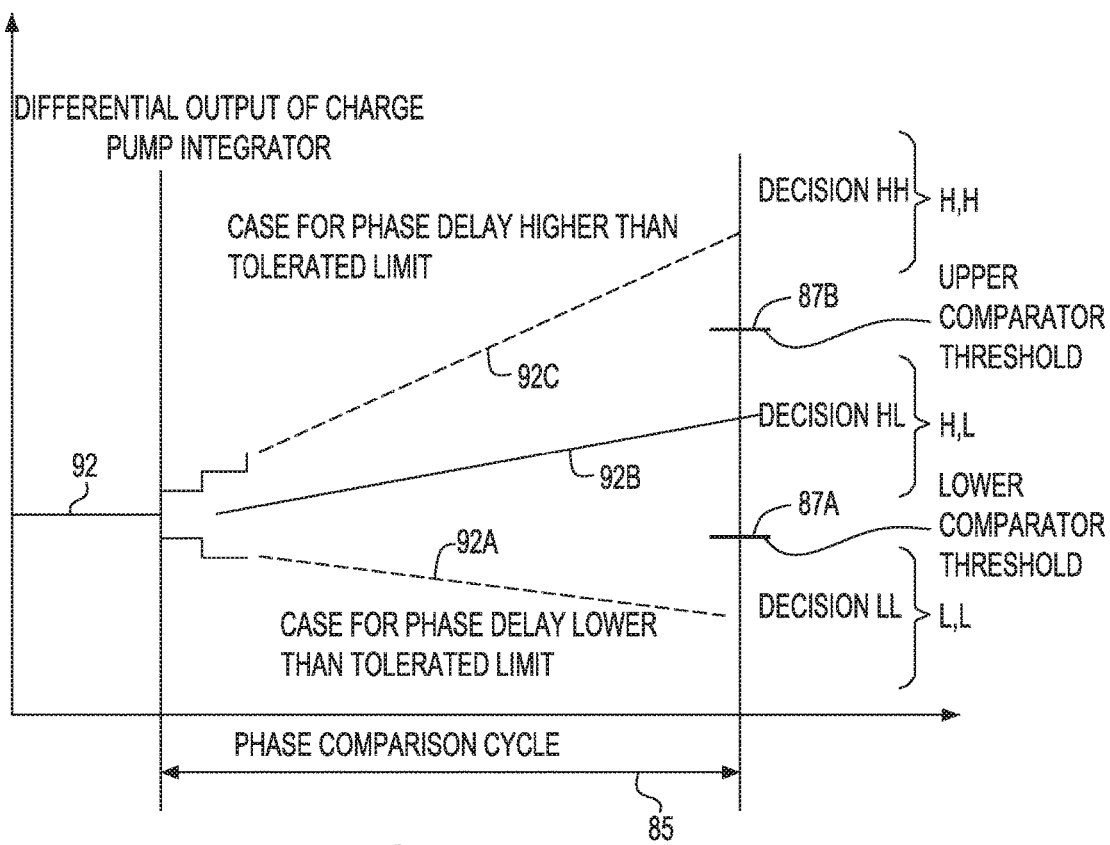
FIG. 6B shows the charge pump output ramp (differential) and comparator thresholds for positive and negative phase error cases.

It can be seen that when the phase difference between clk1 and clk2 is exactly 360*9/32, then both the OUTP and OUTM will just continue to be same as their initial value. If the phase difference is higher than 360*9/32, then OUTP will go up and OUTM will go down. Similarly if the phase difference is lower, then OUTP will go down and OUTM will go up. The differential voltage will keep ramping up due to the integration provided by the respective capacitor C_pd 249 and C_pd 269. Thus the Phase error and its direction can be detected by comparing the differential voltage build up after the phase comparison cycle with fixed threshold voltages at the comparator as illustrated in FIG. 6B. In particular, as described herein with respect to FIG. 6B, the proposed voltage comparator is a fully differential implementation with a differential reference input providing two thresholds, an upper one and a lower one. In one embodiment, for example, a pair of upper and lower reference values (differential voltages) can be High=+50 mV, Low=−50 mV. FIG. 6B particularly illustrates the comparator decisions for various cases of phase detector outputs. The comparator can be implemented using any standard architecture.

Thus, in one embodiment, the comparator circuit 90 of FIG. 3 may be a two threshold differential comparator circuit that receives each of the output ramp signals (representing the phase difference error signals) at the outputs 259, 279 of the charge pump integrator 250. Alternately, comparator circuit 90 may be two comparators having two different (upper and lower) thresholds defining tolerated limits for the detected phase difference.

Referring back to FIG. 5B, the charge pump output ramps up or down depending on the phase error. That is, the slopes of the ramp signals at the outputs 259, 279 of the charge pump integrator 250 are proportional to the phase difference error between the input clocks 13A and 13B.

Figure 10:
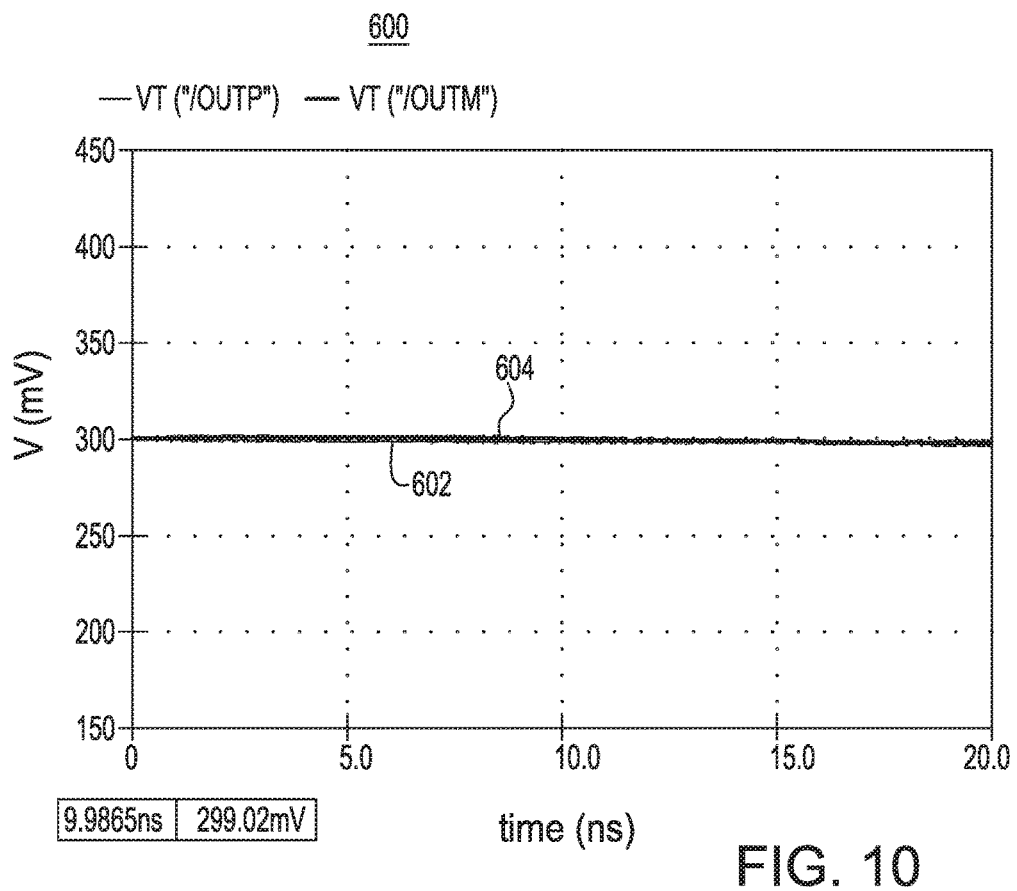
FIG. 10 shows a plot of example charge pump integrator outputs OUT P, OUT M when detecting a zero phase error difference.

For example, FIG. 10 shows a plot 600 of example charge pump integrator outputs OUT P 259, OUT M 279 when detecting a zero phase error difference. In the embodiment depicted in FIG. 10, output voltage value 602 at charge pump integrator output OUT P and output voltage value 604 at charge pump integrator output OUT M are plotted as voltages at the (y-axis) as a function time (x-axis) in the system 75. Zero input phase error means the phase difference between clk1 and clk2 is exactly equal to nine (9) Rotator codes. This example result may be corrected in a pre-calibration phase based upon the fixed offset implemented for a particular PI constellation configuration being calibrated.

Figure 10A:
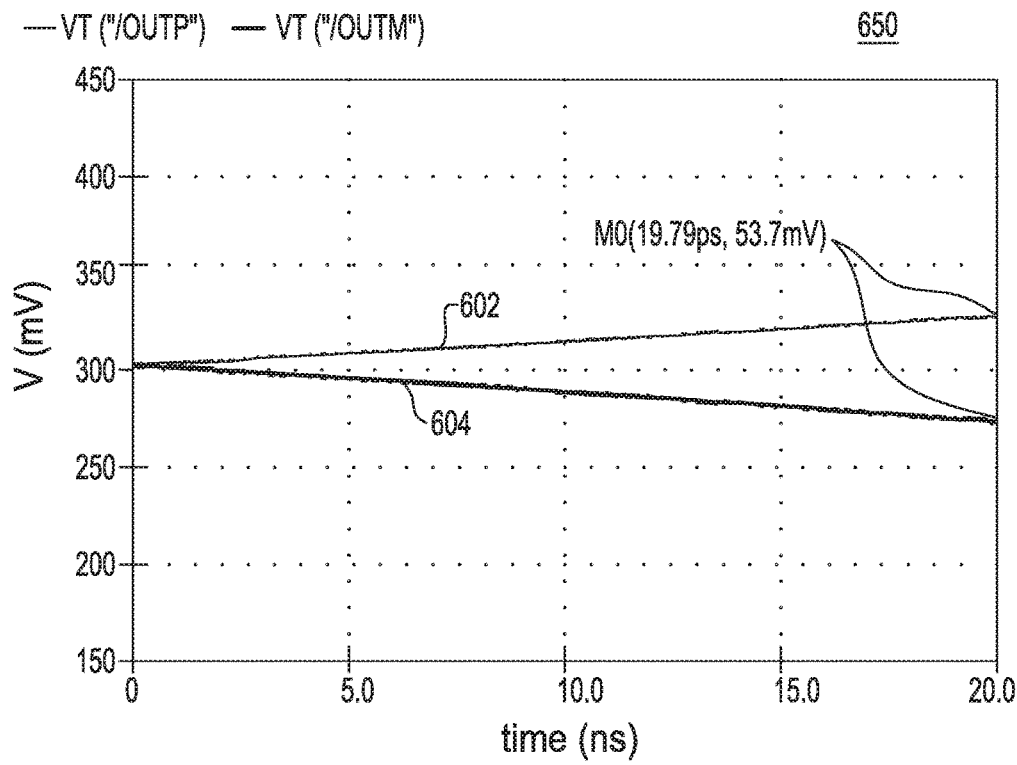
FIG. 10A shows a plot of an example charge pump integrator outputs OUT P, OUT M when the input phase difference error is +0.5 LSB Rotator code.

FIG. 10A shows a plot 650 of an example charge pump integrator outputs OUT P 259, OUT M 279 when the input phase difference error is +0.5 LSB Rotator code. In the example depicted in FIG. 10A, output voltage value 602 at charge pump integrator output OUT P and output voltage value 604 at charge pump integrator output OUT M are plotted as voltages at the (y-axis) as a function time (x-axis) in the calibration system 75. The system converts the phase error of 0.5 LSB Rotator code to about 53 mV voltage value at the end of a phase measurement cycle.

Figure 10B:
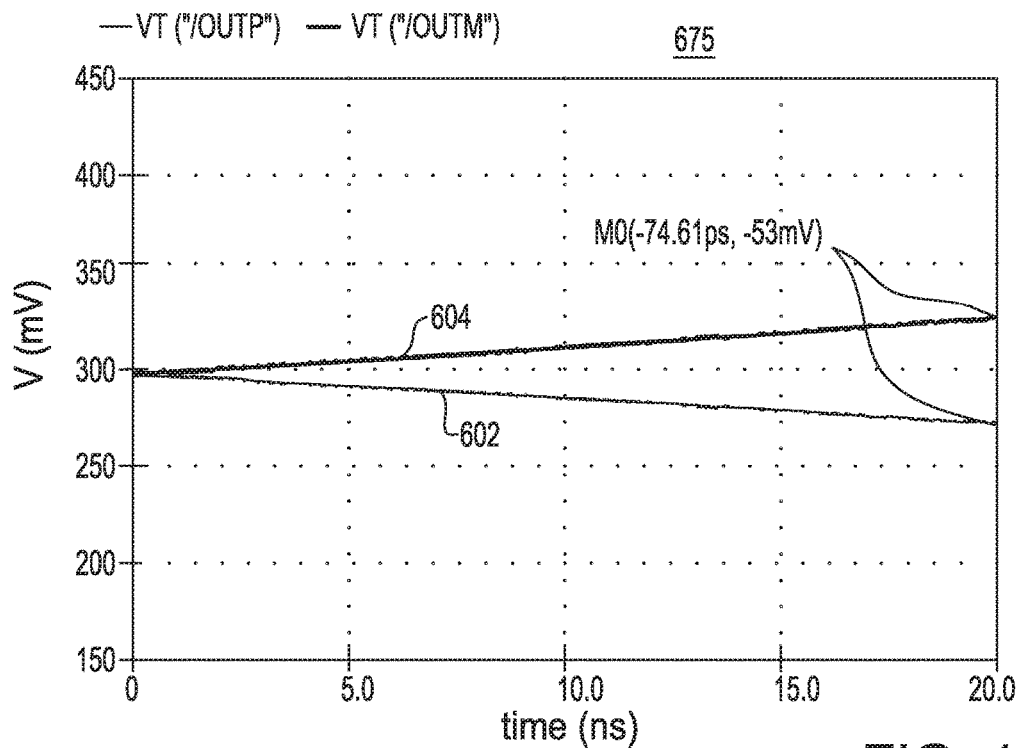
FIG. 10B shows a plot of an example charge pump integrator outputs OUT P, OUT M when input phase difference error is −0.5 LSB Rotator code.

FIG. 10B shows a plot 675 of an example charge pump integrator outputs OUT P 259, OUT M 279 when input phase difference error is −0.5 LSB Rotator code. In the example depicted in FIG. 10, output voltage value 602 at charge pump integrator output OUT P and output voltage value 604 at charge pump integrator output OUT M are plotted as voltages at the (y-axis) as a function time (x-axis) in the system 75. The system converts the phase error of −0.5 LSB Rotator code to about −53 mV voltage value at the end of a phase measurement cycle.

As shown in FIGS. 10A, 10B, the ramp is allowed to build up for a predetermined time referred to as the phase measurement cycle which may have many 10's of cycles of clocks, before getting compared with reference voltages at the comparator. The integration of phase error pulses for many cycles helps to limit the jitter interference bandwidth. As shown in FIG. 6A, the charge pump integrator 250 integrates many phase error pulses 99 at the output of phase detector 200 during a single phase comparison cycle 85 of N clock cycles. In this manner, any jitter noise gets integrated over N cycles. This filtering limits the effective jitter noise bandwidth to Fclk/N where Fclk is the clock frequency of Data and Edge clocks. The jitter noise power reduces due to the low pass filtering offered by the integration. The number of clock cycles in a single comparison cycle N can be increased by increasing the charge pump integrator capacitance or by reducing the charge pump current value.

Figure 7:
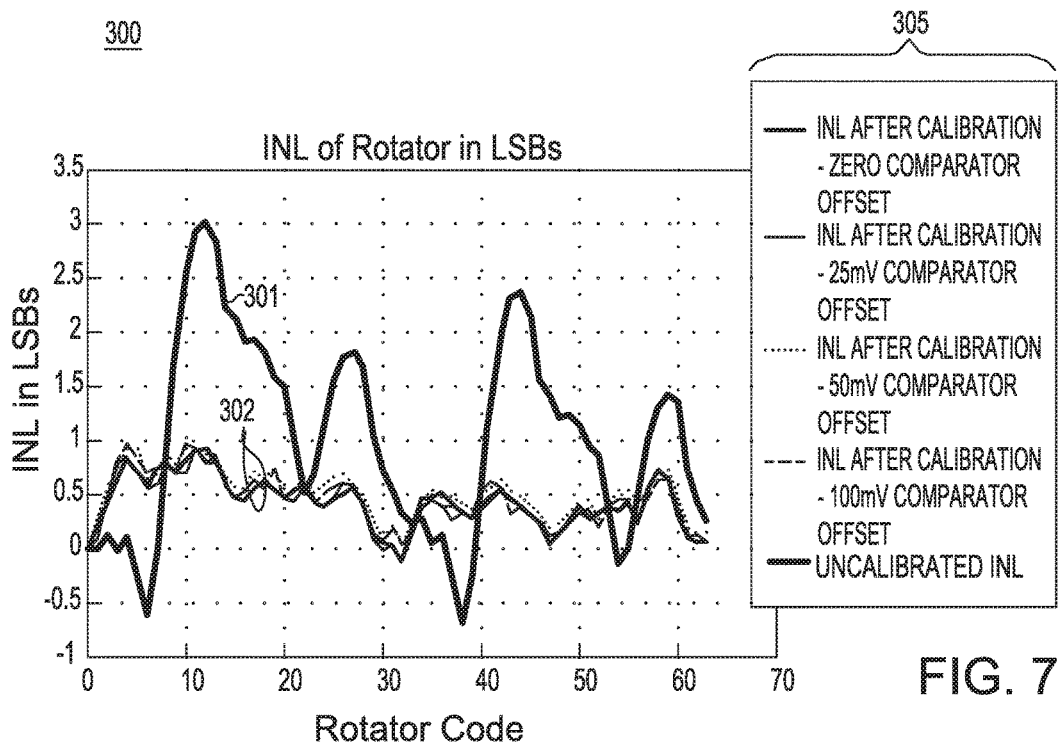
FIG. 7 which is a plot showing an effect on a calibration accuracy based on threshold variation in the comparator circuit.

In a further embodiment, the system and method provides for a phase comparison by comparing the phase difference with respect to a current ratio. The current ratio provides a very accurate reference within an integrated circuit. When programmed with sufficient gain in the charge pump integrator, it is seen that the calibration accuracy is fairly independent of the variations in the voltage reference value or the threshold value in the following comparator stage. This is illustrated in FIG. 7 which is a plot 300 showing an effect on a calibration accuracy measured as INL errors in least significant bit (LSB) values (y-axis) as a function of a particular Rotator Code (x-axis) for plots 302 of errors for several phase adjustments at different threshold variations 305 in the comparator circuit. Also shown is a plot 301 of the INL errors for the uncalibrated PI instance. As shown, the calibration 300 does not change much for plots 302 upon different comparator device thresholds 305. The calibration accuracy, e.g., INL errors, are however sensitive to current ratios, and nominal I_UP to I_DOWN1,IDOWN2 current ratios are maintained to detect the phase error from the ideal phase difference between the clocks for a particular code offset.

Referring back to FIG. 3, the calibration logic circuit 95 receiving programmed digital codes, i.e., Data Rotator Codes 27 and Edge Rotator Codes 47 in the closed loop calibration system 75 implements a method 100 to calibrate a phase interpolator of any phase interpolator implementation, such as the 64 position phase interpolator 10 described herein with respect to FIGS. 1 and 2.

Figure 4:
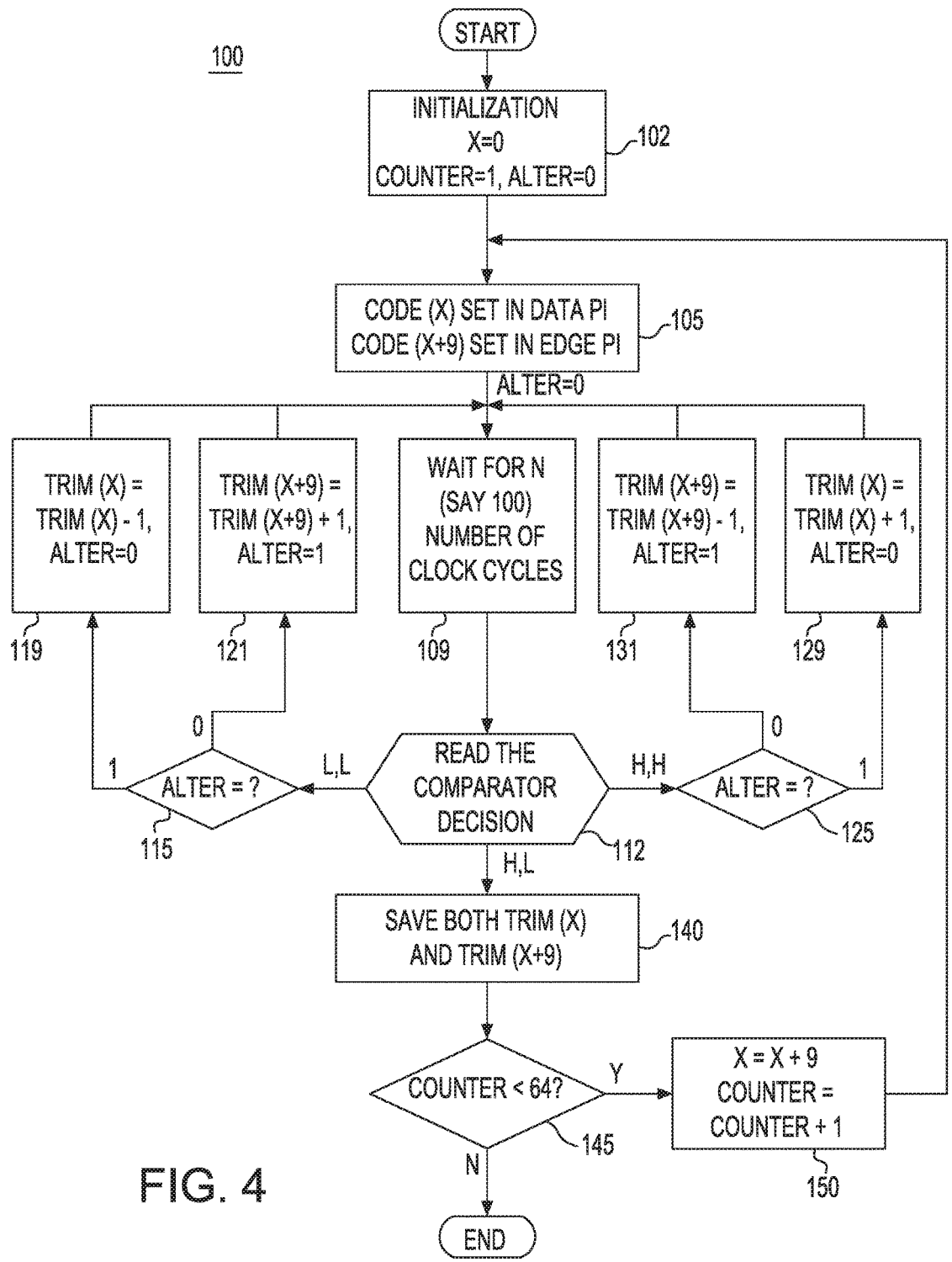
FIG. 4 depicts a calibration method for controlling the calibration hardware of FIG. 3 in one embodiment.

FIG. 4 depicts a method 100 alternately referred to as phase interpolator calibration algorithm for calibration of the 64 position phase interpolator apparatus 10 of FIG. 3. The method operates to remove any offset errors in the phase measurement apparatus which can potentially degrade the calibration effectiveness. As will be described in greater detail herein below, the phase measurement apparatus is immune to the random jitter.

As the closed loop calibration system 75 of FIG. 3 includes two interpolator instances present in the clock data recovery (CDR) module: one for the Data sampling clock and other for the Edge sampling clock, and since these two are essentially the same in design and layout, they are well matched and a single calibration can be applied common to both. The calibration can be performed at a startup time, or at specific intervals where the input links are not operational, so that they can calibrate against most of the static errors, and also against dynamic errors (e.g., induced by real time temperature or voltage drift).

The calibration algorithm is designed in such a way that it is capable to calibrate all the phase positions, at the same time, and simplifies the calibration hardware implementation. It always selects the same code offset (e.g., of "9" codes in one example embodiment) between the data and edge interpolators during the calibration procedure and thus makes the calibration hardware optimized for such a case.

At every calibration step three processes occur:

1) The DATA rotator is given code X input at its DACs and EDGE rotator receives input Code Y at its DACs where in an optimum case, Y=X+9. It is understood that for calibrating all the "raw" phase control codes, the algorithm maintains a fixed code offset between the two rotators. Thus, in one embodiment, a code offset of a value of 9 between the pairs is selected which permits the calibration of all the 64 raw codes, without having very close phase differences for measurement, i.e., the code offset of 9 is optimum for a 64 phase constellation. The basic requirement is that a "remainder[number-of-phases/phase-offset]=1;"

2) The comparator device looks at the phase difference at the output of DATA and EDGE rotators, and decides whether the phase difference error is more than the tolerated limit OR less than the tolerated limit OR within the tolerated limit; and 3) The digital calibration logic control unit reads the comparator decision and decides if trimming has to be applied and if so, in which direction and on which rotator (DATA or EDGE). The calibration algorithm "ping-pongs" for example, by alternating the trimming processing between the DATA and EDGE rotators between successive steps. The 'Alter' signal in FIG. 3 is just act as a logical memory to do so. Also, in the calibration step, the trim code value is either incremented or decremented by one step. That is, in one embodiment, there are no multiple trim step jumps.

The processes 2) and 3) are repeated without changing the codes X and Y until the comparator output results indicate that the phase difference error is within the tolerated limit. Then the algorithm move on to next code pairs.

As shown in the method 100 of FIG. 4, at a first step 102 the calibration procedure initiates setting phase control codes to the I and Q rotators of a first code pair different by enough to produce a phase difference between the rotator outputs sufficient to be detected with minimal error by the phase-to-voltage converter of phase detector block 80 (of FIG. 3). In the embodiment of the method depicted in FIG. 4, a phases rotator code word "X" is initialized to zero, i.e., X=0, and two variables are further initialized: a counter value ("Counter") initialized to a value of 1, i.e., Counter=1, and a logic variable ("Alter") value initialized to a value of 0, i.e., Alter=0. The Counter tracks the number of phases of the PI constellation.

Then, at 105, the calibration procedure initiates setting and inputting phase control codes to the I and Q rotators of a first code pair differently, e.g., by setting a first Code (X) for the DACs 37 programming Data Mixer 36 of the PI 10 and further setting a second Code(X+9) for the DACs 57 programming the Edge Mixer 56 of the PI. Further at this step 105, the variable Alter is reset to zero, i.e., Alter=0.

To help optimize the phase error measurement and calibration apparatus 75, a next step 109 is to wait for N number of clock cycles. As a non-limiting example, the logic may enforce a wait time of approximately N=100 clock cycles. During this wait time, in the method 100, the PI adjusted clocks 13A, 13B have time to stabilize and integrate the phase difference error using the phase detector charge pump.

Then, at 112, the voltage at the output of the comparator circuit 90 is read by the calibration logic circuit 95 and a decision rendered which may be indicative of the need to provide a DAC trim offset, i.e., depending on the magnitude and direction of the detected phase difference error, i.e., if the phase difference error detected between the data clock 13A and edge clock signal 13B components is higher than both the comparator thresholds (H, H) or lower than both the comparator thresholds (L, L) of signals 87 as based on the comparison at two threshold differential comparator circuit 90.

In one embodiment, as illustrated in FIG. 6B, there is depicted one single phase comparison cycle 85 of phase error detection and comparison decisions for various cases of phase detector outputs at the comparator circuit 90. If the phase difference detected between the input voltages (i.e., clock signals 13A out of data mixer 36 and clock signals 13B out of edge mixer) as signal 92A is lower than the respective two thresholds 87A, 87B set for acceptable phase difference, the combined decision is evaluated as L, L. If however, the phase difference detected between the input voltages 13A, 13B as signal 92C is above the set two thresholds 87A, 87B, the combined decision is H, H. If the phase difference detected between the input voltages as signal 92C is detected between the two set thresholds 87A, 87B, this results in an H, L decision. In FIG. 4, an H, L result of the phase difference comparators informs calibration logic circuit 95 that the input phase error is within tolerated limits.

Thus, for example, at step 112 if the phase error output signal 85 is less than the voltage references 87A, 87B rendering an output error signal 92 to a Low (L, L) state, this is indicative of requiring a Trim DAC adjustment to augment the bias current applied to the PI data mixer 36 and/or PI edge 56 (FIG. 3). A decision is then made at 115 to determine the current state (value) of the Alter variable. If at 115, the Alter variable is currently at a value of zero (i.e., Alter=0), then the process proceeds to step 121 where the Trim code value corresponding to the second Code(X+9) for the Edge Mixer 56 of the PI 10 is first incremented. That is, at 121, the value of Trim(X+9)=Trim(X+9)+1. The Alter variable is then reset to a value of 1, i.e., Alter=1 and the process returns to step 109 to repeat waiting for the clock cycles wait time and perform a new phase error evaluation process at 112 in the same single phase comparison cycle. This subsequent phase error evaluation step 112 is performed in the same single phase comparison cycle for the apparatus 10 however with a further "Trim" current code 97 generated by the calibration logic circuit 95 now being applied to the Trim DAC 83B at the Trim(X+9)+1 incremented value.

Returning to step 112, if the phase error output signal 85 is evaluated less than the voltage references 87A, 87B rendering an output error signal 92 to a Low (L, L) state, and at 115, if the Alter variable is currently determined to be at a value of one (i.e., Alter=1), then the process proceeds to step 119 where the Trim code value corresponding to the first Code(X) for the PI Data Mixer 36 of the PI 10 is decremented. That is, at 119, the value of Trim(X)=Trim(X)−1 in this single phase comparison cycle. The Alter variable is then reset to a value of 0, i.e., Alter=0 and the process returns to step 109 to repeat waiting for the clock cycles wait time and perform a new phase error evaluation process at 112. This phase error evaluation step 112 is performed for the apparatus 10 however with a further "Trim" current code 93 generated by the calibration logic circuit 95 now being applied to the Trim DAC 83A at the Trim(X)−1 decremented value.

It is understood that corresponding steps are performed by the calibration logic circuitry 95 to provide an offset, i.e., depending if the magnitude and direction of the detected phase difference for the data and edge clock signals is high (H, H) as based on the comparison against the optimized reference voltage levels 87A, 87B shown in FIG. 6.

Thus, at step 112, FIG. 4, if the phase error output signal 85 is greater than the voltage reference signals 87A and 87B rendering an output error signal 92 to a High (H, H) state, then this is indicative of requiring a Trim DAC adjustment to augment the bias current applied to the PI data mixer 36 and/or PI edge 56 (FIG. 3). A decision is then made at 125 to determine the current state (value) of the Alter variable. If at 125, the Alter variable is currently determined to be at a value of zero (i.e., Alter=0), then the process proceeds to step 131 where the Trim code value corresponding to the second Code(X+9) for the Edge Mixer 56 of the PI 10 is decremented. That is, at 131, the value of Trim(X+9)=Trim(X+9)−1. The Alter variable is then reset to a value of 1, i.e., Alter=1 and the process returns to step 109 to repeat waiting for the clock cycles wait time and perform a new phase error evaluation process at 112 in the same phase calibration cycle. This subsequent phase error evaluation step 112 is performed for the apparatus 10 however with a further "Trim" current code 97 generated by the calibration logic circuit 95 now being applied to the Trim DAC 83B at the Trim(X+9)−1 decremented value.

Similarly, at step 112, if the phase error output signal 85 is greater than the voltage comparator reference signals 87A, 87B rendering an output error signal 92 to a High (H, H) state, and at 125, if the Alter variable is currently determined to be at a value of one (i.e., Alter=1), then the process proceeds to step 129 where the Trim code value corresponding to the first Code(X) for the PI Data Mixer 36 of the PI 10 is incremented. That is, at 129, the value of Trim(X)= Trim(X)+1. The Alter variable is then reset to a value of 0, i.e., Alter=0 and the process returns to step 109 to repeat waiting for the clock cycles wait time and perform a new phase error evaluation process at 112 in this same phase calibration cycle. This subsequent phase error evaluation step 112 is performed for the apparatus 10 however with a further "Trim" current code 93 generated by the calibration logic circuit 95 now being applied to the Trim DAC 83A at the Trim(X)+1 incremented value.

In the same single phase comparison cycle, the wait steps 109, evaluation step 112, and Trim DACs 83A, 83B adjustment steps 119 and 121 or 129 and 131 are thus repeated so that the auxiliary trim DACs 83A, 83B are adjusted using the calibration logic engine 95 until the comparator output decides that the phase difference between the I and Q rotators are accurate to within tolerable limits defined between voltage comparator reference signals 87A, 87B. Once obtained, at 140, FIG. 4, the resulting Trim(X) and Trim(X+9) codes in the pair are stored in a memory storage device (not shown). These trim codes are recalled from the table and applied along with the main codes whenever these codes are used in CDR operations thereafter. In this manner, the calibration procedure corrects for any errors by adjusting the DAC weights finely by the further thermometric Trim DACs 83A, 83B.

This single phase comparison cycle processing described as shown in FIG. 4, defines essentially a ping-pong trimming procedure between the rotators that helps to avoid rotation of the constellation, and thus to limit the trim range needed. That is, a feature of the algorithm is that it 'alters' or 'ping-pongs' the trimming procedure between the two phase positions (using the "Alter" variable value) during a particular calibration step.

For example, in a single phase comparison cycle processing depicted in FIG. 4, the following example steps may result:
1: DATA→code X, EDGE→Code Y (=X+9)
2. Is the Phase error within the tolerated limit→NO
3. Trim DATA Mixer by one step
2. Is the Phase error within the tolerated limit→NO
3 Trim EDGE Mixer by one step
2. Is the Phase error within the tolerated limit→NO
3. Trim DATA Mixer by one step
- - -
2. Is the Phase error within the tolerated limit→YES
1. DATA→code X+9, EDGE→Code Y (=X+18) and so on
. . . .

The ping-ponging between successive phase comparison cycles helps to contain the trim codes within a realizable range even after multiple rounds of calibration. It also helps to randomize the phase errors between steps so that an overall lower INL number can be achieved.

Once the calibration is over, the obtained Trim codes (shown as Trim(X) in the algorithm flow chart) are stored into a lookup register within the chip. From that point onwards, whenever a Rotator code is applied to any of the Rotators, the corresponding Trim Code is also retrieved from the look up and be applied to the Trim DAC of that Rotator so that the fine correction in phase position is possible.

In the method of FIG. 4, at step 140 after saving both Trim(X) and Trim(X+9) code trim values, the process proceeds to step 145 where a determination is made as to whether all clock phases of the 64 phase constellation PI have been processed for DAC trim current calibration in the phase comparison cycle processing of FIG. 4. Thus at 145, a determination is made as to whether the current Counter value is less than 64. If the Counter value is equal to 64, then the process ends. As long as the Counter variable is determined as less than 64 (i.e., Counter values<64), the process repeats for the next phase of the constellation. That is, at step 150, the Code value is incremented as X=X+9, and the Counter value is also incremented, i.e., Counter=Counter+1. Then the process returns to 105, FIG. 4 where the new DAC code value Code (X) is set in the Data PI and Code(X+9) is set in the Edge PI. Additionally, the Alter variable is again reset to zero, i.e., Alter=0, and the single phase comparison cycle processing steps are repeated until resulting new Trim(X) and Trim(X+9) codes in the pair are obtained for that phase are stored in a memory storage device.

The method 100 of FIG. 4 is repeated with each of the second, third, et seq. code pairs having the same separation as the first code pair, i.e., both being incremented by same amount until all codes have been calibrated.

That is, as described earlier, the offset between the data and edge interpolators are kept constant for the entire calibration process. Thus, the phase difference between the input clocks to the phase detector always spans within a short range about a nominal value. So the phase detector and rest of the hardware is designed to handle this predetermined input phase difference. The offset between the two interpolators is carefully chosen as it is found that if the offset chosen is too small, then it will present very closely spaced signals at the input of the phase detector and this will demand a quick enough phase detector to detect the phase difference. The phase position offset is carefully chosen to be a prime number with respect to the constellation size, e.g., 64 in the embodiment depicted, rendering in this example embodiment an offset of "9". In one embodiment, the method 100 of FIG. 4 using a 9 code offset between the pairs, allows the measurement and calibration to be performed of all the 64 raw codes, without having very close phase differences for measurement. In different implementations utilizing different PI phase constellation and DAC mixer embodiments, this code offset between the pairs may be different. In the present embodiment described by way of example for a 64 phase constellation, when starting with code0, the code pair selections, i.e., code combinations for successive calibration steps, proceeds in the method 100 of FIG. 4 as follows with "D" representing Data and "E" representing Edge:
  1. Code0(D)-Code9(E)
  2. Code9(E)-Code18(D)
  3. Code18(D)-Code27(E)
  4. Code27(E)-Code36(D)
  5. Code36(D)-Code45(E)
  6. Code45(E)-Code54(D)
  7. Code54(D)-Code63(E)
  8. Code63(E)-Code8(D)
  9. Code8(D)-Code17(E) . . . and so on.

It can be seen that in the example processing described for a 64 PI phase constellation, after 8 calibration steps, the calibration repeats in the phase constellation on one point below the points calibrated in the earlier round. Thus after 64 rounds of calibration, all the points get calibrated. It can be seen that the calibration of 64 points can again be repeated with the Trim Codes found from earlier calibrations. This will further reduce the INL errors.

It is understood that as each and every code (phase position) of the PI is calibrated, there will be a trim value obtained for each phase position. Therefore, for a 64 phase position PI implementation, there will be 64 trim codes. After the calibration is done these codes are saved into the memory. Whenever a PI code X is applied threafter, the trim code corresponding to X is retrieved from this table and that is also applied via the trim DACs.

Figure 8:
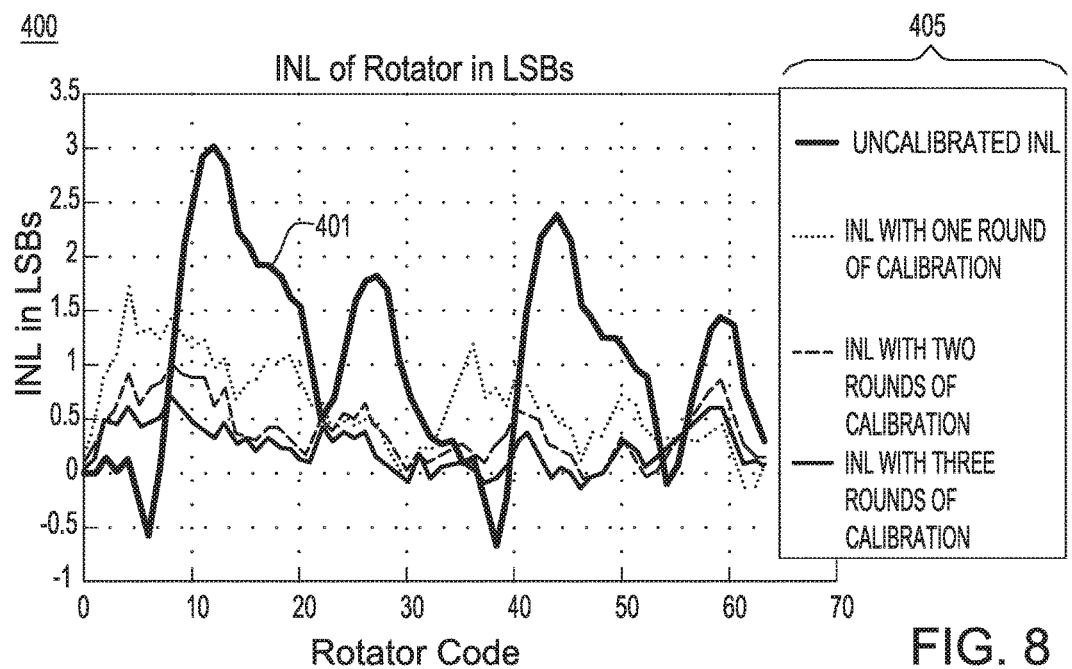
FIG. 8 depicts an example plot 400 showing implementation of the algorithm resulting in INL improvements after successive calibrations.

FIG. 8 depicts an example plot 400 showing implementation of the algorithm resulting in INL improvements after successive calibrations. As illustrated in FIG. 8, plot 400 shows an effect on a calibration accuracy measured as INL errors in least significant bit (LSB) values (y-axis) as a function of a particular Rotator Code (x-axis) for plots 402 of errors for several phase adjustments at a different number of calibration rounds 405 of the method 100. Also shown is a plot 401 of the INL errors for the uncalibrated PI instance. As shown, the resulting INL errors of plots 402 decrease upon different number of calibration rounds 405.

Figure 9A:
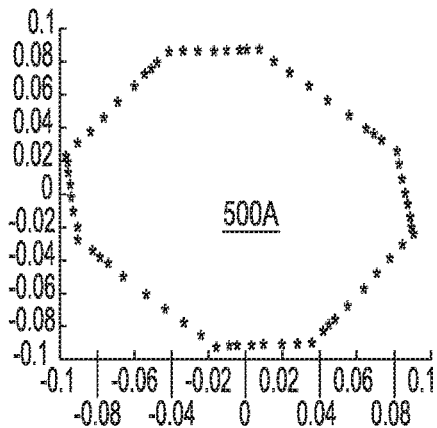
FIG. 9A shows a plot of the 64 phase constellation of the PI Rotator implementation of FIG. 2 before calibration.
Figure 9B:
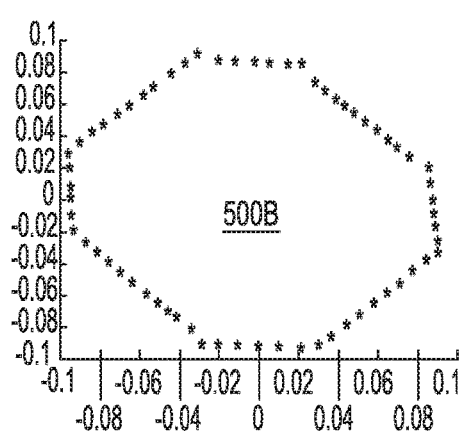
FIG. 9B shows a plot of the 64 phase constellation of the PI Rotator implementation of FIG. 2 after calibration according to the methods herein.

FIG. 9A shows a plot 500A of the 64 phase constellation of the PI Rotator implementation of FIG. 2 before calibration, and FIG. 9B shows a plot 500B of the 64 phase constellation of the PI Rotator implementation of FIG. 2 after calibration according to the methods described. The plot 500B of FIG. 9B shows marked improvement in phase separation of (and uniformity in) the 64 phases in the PI phase constellation with phase separation between all code pairs forced to the same value.

Once the calibration is over, the obtained Trim codes (shown as Trim(X) in FIG. 4 flow chart) are stored into a lookup register within the integrated circuit chip. From that point onwards, whenever a Rotator code is applied to any of the Rotators, the corresponding Trim Code must also be retrieved from the look up and be applied to the Trim DAC of that Rotator so that the fine correction in phase position is possible.

As any inaccuracies in the phase error measurement can directly impact the accuracy of the calibration, to mitigate that, a self calibration procedure of the phase measurement system is provided. This system and method can be used for a self-calibration i.e., to measure and correct any offset errors present in the phase detector.

For example, self-calibration may be used to address any potential rise and fall delay mismatches of the current pulses in the charge pump. The area of the I_UP current pulses in the charge pump contains the phase error information obtained from the phase detector. So, any error in the area of the I_UP current pulses will directly impact the phase measurement accuracy. At high frequencies the I_UP current pulse's shape, such as the resulting pulse shape I_PULSE1 of the first integrator branch, may be subject to distortion due to the finite rise and fall delays of the circuit as is illustrated in FIG. 11.

Figure 11:
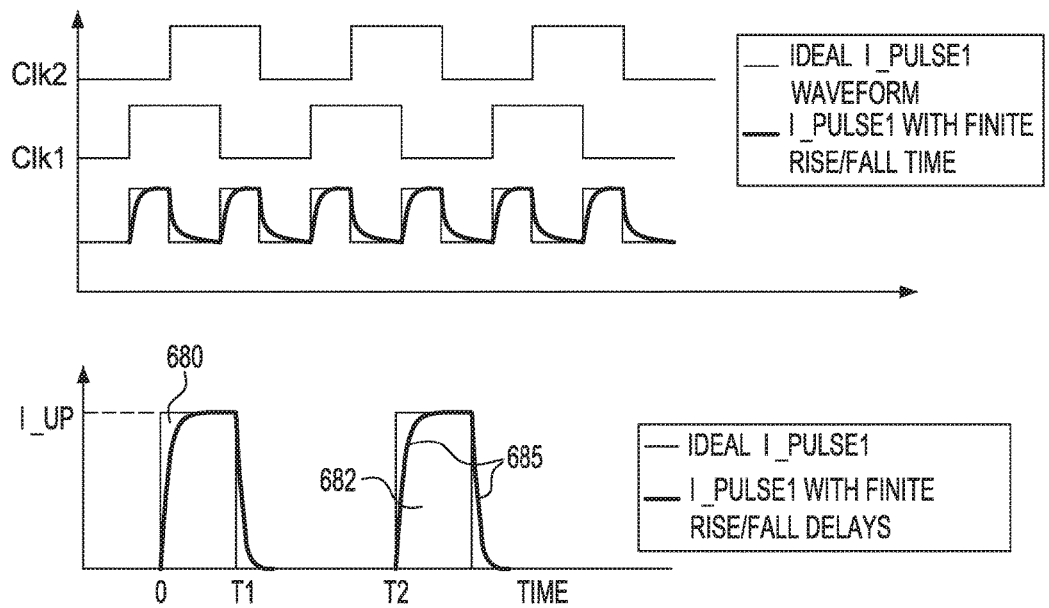
FIG. 11 shows a diagram of an example I_UP pulse shape due to finite rise/fall delays 685.

FIG. 11 shows the resulting I_PULSE1 pulse shape 682 due to finite rise/fall delays 685 as compared to the ideal (cntl and cntlb) pulse shape 680. IN view of FIG. 11, the area of the I_UP pulse with finite rise and fall delays 285 can be calculated as follows:

if $\tau 1$ and $\tau 2$ are the rise and fall time constants respectively, then the area under the I_PULSE1 can be written as $$A = I\_UP[\int_0^{T1}(1-e^{-t/\tau 1}) + \int_0^{T2-T1} e^{-t/\tau 2}]$$

$$A = I\_UP[T1 + \tau 1 - \tau 2 + \tau 1 e^{-T1/\tau 1} - \tau 2 e^{-(T2-T1)/\tau 2}]$$

$$A \approx I\_UP[T1 + \tau 1 - \tau 2]$$

when $\tau 1$ and $\tau 2$ are about 20% of T1 and T2-T1

Now, the error term is I_UP $(t_1-t_2)$, which disappears when the rise delay $t_1$ and fall delay $t_2$ matches. If they do not match, this error will appear as a constant 'offset' in the phase error measurement system. To keep the error below a rotator LSB, that is 2 ps, the rise and fall delays need to match by 1 ps across corners.

Figure 12:
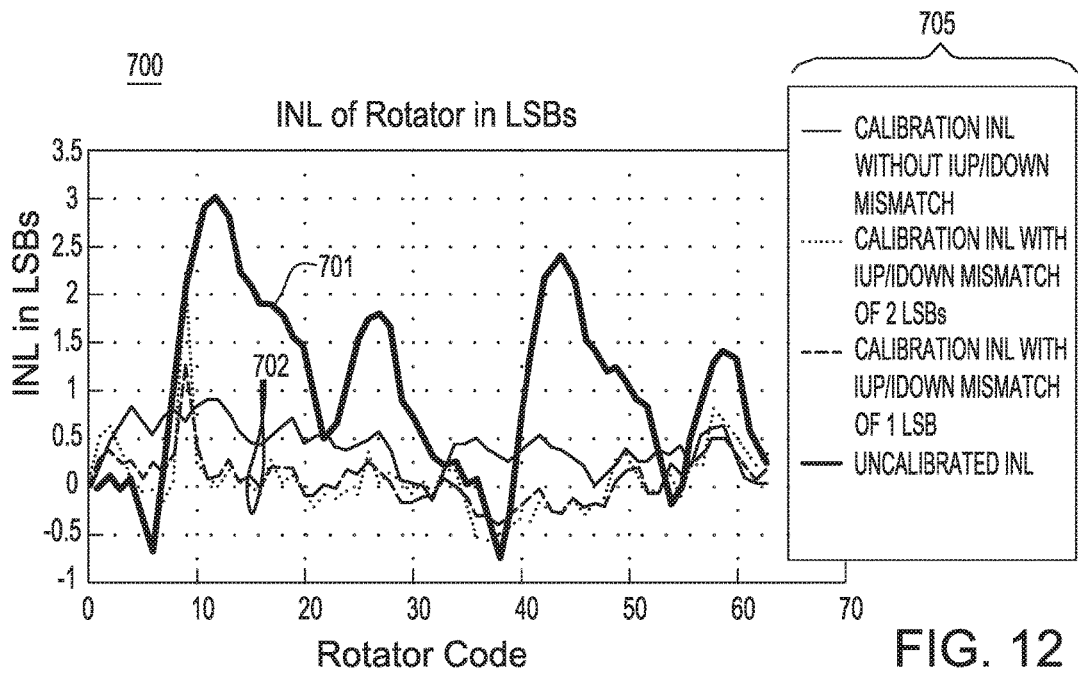
FIG. 12 is a plot depicting the effect of ratio mismatch between I_UP and I_DOWN currents in the 64 position phase rotator implementation of the embodiment described.

As a further example, self-calibration may be used to address any I_UP/I_DOWN ratio errors in the charge pump. The phase measurement system uses the I_UP/I_DOWN ratio as the reference for the phase error measurement, and so any error in this current ratio can directly affect the phase error measurement. This is evident from the results shown in FIG. 12 depicting the effect of ratio mismatch between I_UP and I_DOWN currents. For a 64 position rotator, to get the error within 0.5 LSB, at least 7 bit matching between the I_UP and I_DOWN current sources is needed. As illustrated in FIG. 12, plot 700 shows an effect on a calibration accuracy measured as INL errors in least significant bit (LSB) values (y-axis) as a function of a particular Rotator Code (x-axis) for plots 702 of errors for several mismatches of I_UP/I_DOWN currents 705 as measured in various Least Significant Bit values. Also shown is a plot 701 of the INL errors for the uncalibrated PI instance. As shown, the resulting INL errors of plots 702 are sensitive to any errors in the current ratios 705.

As a further example, self-calibration may be used to address any clock jitters. The charge pump integrator 250 of FIG. 5B integrates 10's of cycles of I_UP pulses during a phase comparison cycle as shown in FIGS. 6A, 6B. This results in the clock jitter being averaged out. For an example case, if 100 I_UP pulses are integrated during phase comparison cycle, the effective jitter bandwidth will get reduced to clock frequency/100.

As a further example, self-calibration may be used to address any comparator threshold and offset errors. The effect of threshold variations at the comparator can be reduced by increasing the phase-to-voltage gain of the charge pump integrator. The phase-to-voltage gain if the charge pump integrator can be expressed as $$G = \frac{\text{charge pump voltage output}}{\text{Time error at the phase detector input}} = \frac{N \cdot I\_UP}{C}$$

where N is the number of I_UP cycles in the phase comparison cycle, I_UP is value of charge pump upper current source and C is the charge pump integrator capacitor. Now, the equivalent time error dTE at the phase detector input for a comparator threshold variation of Vth, $$dTE = Vth/G$$

It can be seen that for N=100, I_UP=400 uA, C=100 fF, there is an equivalent phase measurement error of +−0.125 ps for a comparator threshold variation of +−50 mV which is an error of the order of +−LSB/16 and can be ignored.

As a further example, self-calibration may be used to address any delay mis-match between two rotators used for calibration. The delay mismatch can be caused by layout routing mismatches of the clock path. This delay mismatch will again appear as an offset in the phase measurement system.

It can be seen that all the above mentioned factors (other than clock jitter) will manifest as an offset error in the phase measurement system. To address all of those, a self calibration procedure for the phase measurement system is employed, which can find out the total offset error present in the phase measurement apparatus and correct for it.

The self calibration requires a method to find out the offset in the system 75 and an actuator to inject an opposite offset to nullify that. It is known that the phase rotator has a property that the average value of all the DNL (Differential Non-linearity) numbers across all the codes is zero. Extending this, if there is kept two identical rotators (with very similar INL curve) at a code offset of X, then the measured phase delay between these two rotators averaged over all the 64 codes will be equal to X*360/64 degrees. If there is an offset in the phase measurement system used for phase delay measurements (i.e., the XOR phase detector, the charge pump integrator and the comparators), then this number will be X*360/64+offset_in_terms_of_Phase. This result can be used to estimate the offset in the phase measurement system part of the phase interpolator calibrator.

To measure the offset, which can be a fraction of the rotator LSB, and also to nullify that, a fine control in the I_UP/I_DOWN ratio of phase detector charge pump can be employed. The method employs a fine control in the I_DOWN1 and I_DOWN2 current sources as shown in FIG. 5B, in the form of one or more trim current sources 228' having a fraction of the main I_DOWN sources. The hardware modification to charge pump is shown in FIG. 13. with like elements of FIG. 5B.

In particular The I_UP/I_DOWN ratio in the charge pump functions as a reference to measure phase errors during PI calibration. The I_DOWN value can be trimmed using a digital code. In order to find any errors in a measurement apparatus, one would need to measure a known quantity and look at the results. In this context, it is theoretically known that the average of phase errors between phase positions with a fixed offset averaged over all the PI phase positions should be zero. If it is not zero, then that average gives a measure of the offset error in the phase measurement apparatus that we used for the measurement. This property is made use of to measure and correct for the offsets in the apparatus.

Figure 13:
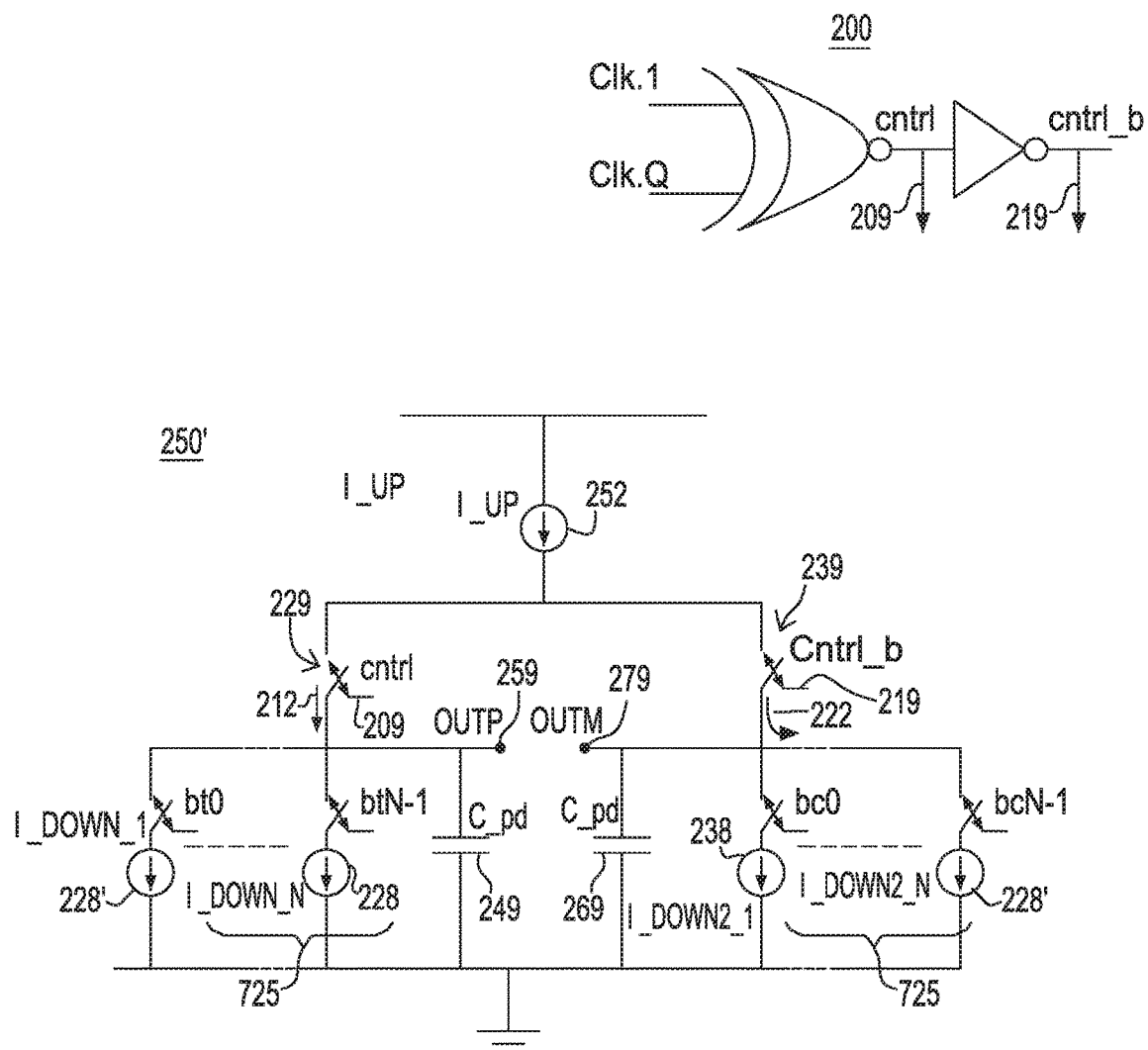
FIG. 13 particularly shows the phase detector element 200 and charge pump integrator circuit 250' modified to employ the self-calibration in one embodiment.

FIG. 13 particularly shows the Phase detector element 200 and charge pump integrator circuit 250' modified to employ the self-calibration. The fine control on I_DOWN1 and I_DOWN2 sources are used to vary the I_UP/I_DOWN ratios. These control are named I_DOWN1 trim an I_DOWN2 trim in FIG. 13.

The self calibration algorithm is as follows:
Start with code0 in rotator1 and code9 in rotator2.
Pass the output clocks of both the rotators into the phase detector.
See the comparator decision after a phase comparison cycle
if decision is HH, then increment the I_DOWN1_trim and decrement the I_DOWN2_trim.
if decision is LL, then decrement the I_DOWN1_trim and increment the I_DOWN2_trim.
if decision if HL, then store the I_DOWN1_trim and I_DOWN2_trim obtained into a table.
Then, continuing the measurement with code1 in rotator1 and code10 in rotator2
continue 64 times to get I_DOWN_trim values for all the 64 codes
find the average of I_DOWN1_trim and I_DOWN2_trim across all the 64 codes and store them as I_DOWN1_trim_avg and I_DOWN2_trim_avg.

Now, to nullify the offset, the method performs injecting the measured offset into the system by modifying the I_DOWN1 and I_DOWN2 values as follows:

$$I\_DOWN1 = I\_DOWN1 - I\_DOWN1\_trim\_avg$$

$$I\_DOWN2 = I\_DOWN2 - I\_DOWN2\_trim\_avg$$

The I_DOWN_trim_avg values are applied through the I_DOWN_trim current sources 725. The I_DOWN1 and I_DOWN2 current source comprise of N smaller current sources, each can be turned ON/OFF by control bits {bt0, . . . , btN−1} and {bc0, . . . bcN−1} respectively. The IDOWN1 and I_DOWN2 currents are trimmed during the pre calibration using these control bits.

Figure 14A:
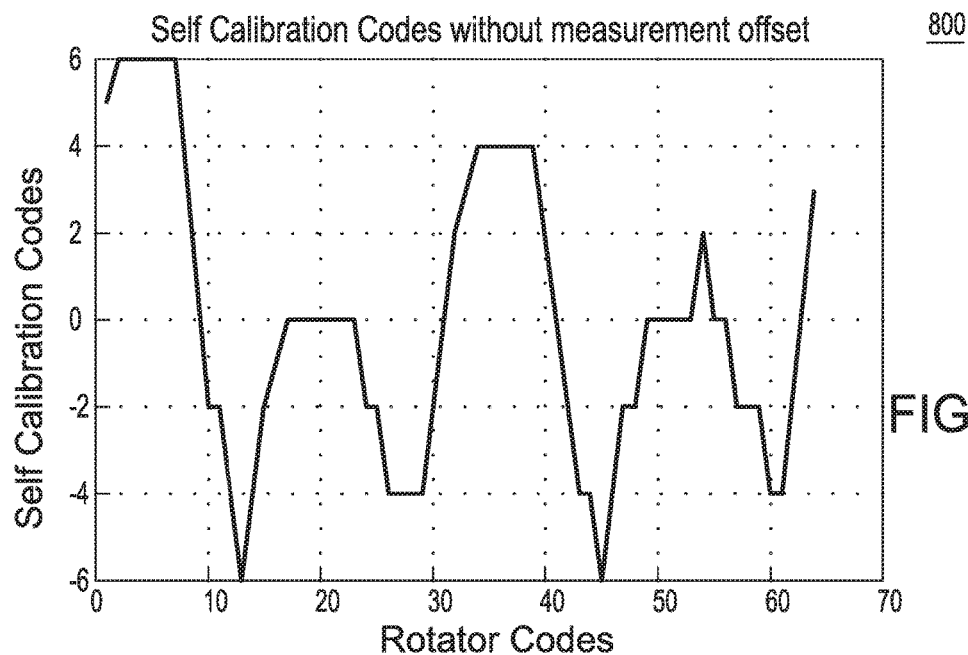
FIGS. 14A and 14B show example results for the I_DOWN1_trim codes with a measurement offset present (FIG. 14A) and without an offset present in the measurement system (FIG. 14B)
Figure 14B:
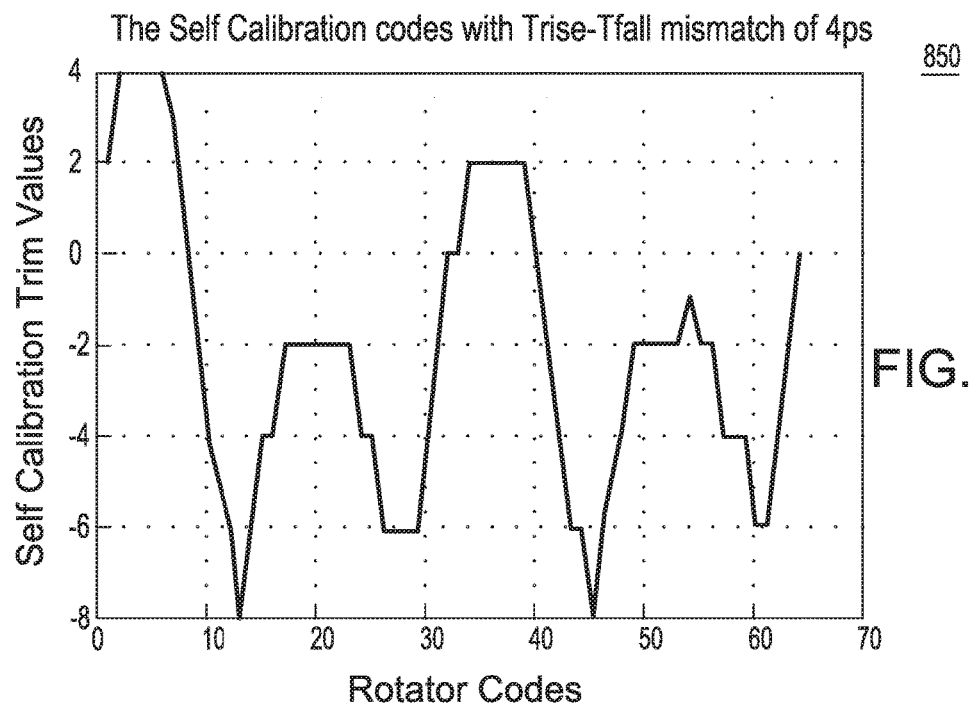

FIGS. 14A and 14B show example results for the I_DOWN1_trim codes with and without an offset present in the measurement system. In particular, FIG. 14A shows a plot 800 of the I_DOWN1_trim values across Rotator codes when no measurement offset is present—an average value of codes=0.047 (close to zero) in the example. FIG. 14B shows a plot 850 of the I_DOWN1_trim values across Rotator codes when a 4 ps (2 LSB) offset is present—average value of codes=2.2 in the example.

In the embodiment depicted in FIG. 14B, the average value of I_DOWN1_trim is 2.2. Since one I_DOWN1_trim step is 10% of the original I_DOWN1 value, the offset correction requires I_DOWN1 to be set as:

$$I\_DOWN1 = I\_UP \cdot 9/32(1-2.2/10)$$

In the example embodiment described herein, the phase detector is configured to measure a 9 code phase offset.

Figure 15:
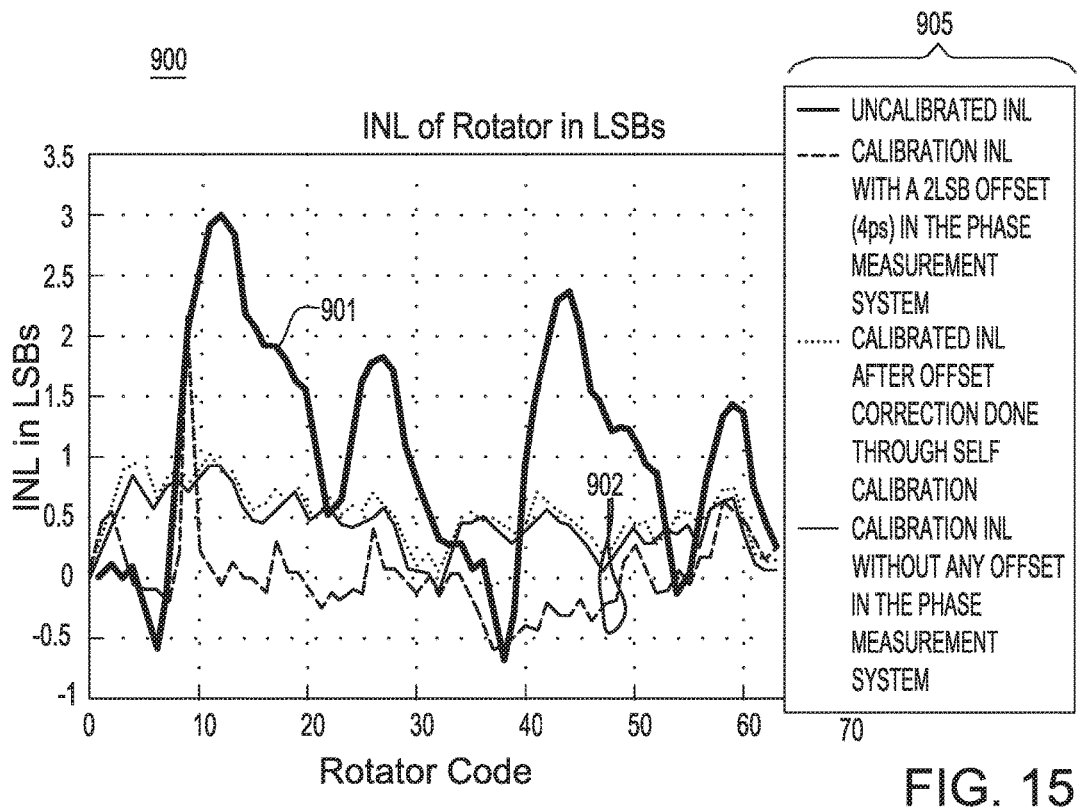
FIG. 15 is a plot 900 depicting effects of self calibration on the final rotator calibration result for various phase offset amounts.

FIG. 15 shows the INL numbers obtained with and without performing a self calibration, when an offset is present in the phase measurement system. As illustrated in FIG. 15 a plot 900 shows example final rotator calibration results 902 and an effect on a calibration accuracy measured as INL errors in LSB values (y-axis) as a function of a particular Rotator Code (x-axis) for various applications of self-calibration with inherent amounts of phase offsets 905 in the phase measurement system. Also shown is a plot 901 of the INL errors for un-calibrated PI instance.

In a further aspect, the present disclosure provides a system and method providing on-the-fly calibration. The on-the-fly calibration is beneficial if the rotator INL drifts considerably with dynamic parameters like temperature and supply voltage. On-the-fly calibration means continuous measurement and correction of phase errors. This can be performed in one embodiment as a dynamic correction after the start-up rotator calibration is completed. To implement on-the-fly calibration, extending the use of programmable charge pump 250' shown in FIG. 13, there is provided a phase measurement system that is programmed to measure the data-to-edge clock phase differences during the normal operation of the CDR system. First, the method initiates configuring the charge pump IUP/IDOWN ratio according the rotator codes going to the Data and Edge rotators. Then, at every phase measurement cycle, the trim setting of each rotators is adjusted based on the comparator decisions. Since only the trim adjustments are done, the out going clocks are not much disturbed.

To illustrate the above described procedure, an example is where data and edge rotators are about 90 degrees apart in phase are considered. In this example, the Rotator code difference between these two rotators is about 16. Now, the programmable charge pump 250' IUP/IDOWN current ratio can be programmed using a coarse IDOWN adjustment to match 32/16. After each phase measurement cycle, depending on the comparator decision, the rotator trim codes (either for one rotator or for both of them, can be adjusted to get the comparator decision to the HL state.

Figure 16:
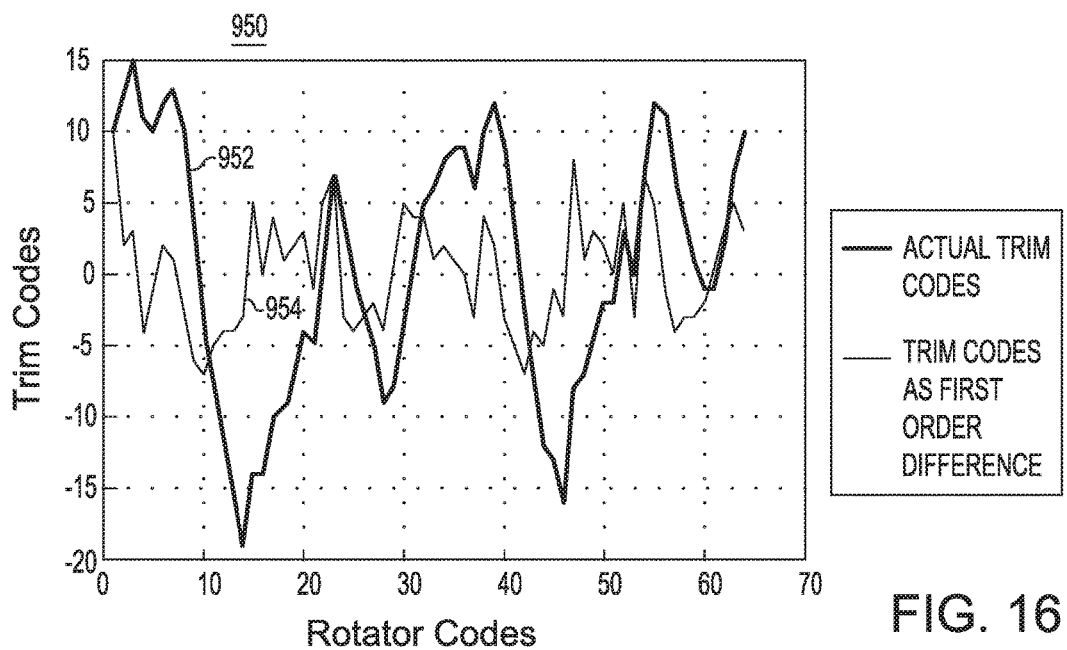
FIG. 16 shows a plot 950 depicting the resulting efficiency obtained in storing the first order difference of the actual trim codes obtained rather than the actual trim code values.

Post start-up calibration, there is a need to store all the 64 codes of the rotator in a register memory for future usage. To reduce the memory usage of such a storage, a more efficient storage technique takes advantage of some of the properties of the trim codes obtained. It can be shown that a major portion of the rotator INL numbers across 64 codes shows good correlation to their adjacent values. This is because the INL degradation is mainly caused by imperfections in the I and Q clocks going into the IQ mixer, which cause periodic degradation in the phase positions of the rotator constellation. Since the INL numbers are correlated, the successive trim values obtained also show correlation across codes. Such a highly correlated data can be stored as their first order differences, with a lesser dynamic range. That is, the trim_code0 is stored as such, trim_code1 is stored as trim_code1-trim_code0, trim_code2 is stored as trimcode2-trim_code1 and so on. This reduces the word length required for these values to get stored, thereby reducing the number of registers required for storage. This is shown in FIG. 16 as a plot 950 of actual Trim codes storage (y-axis) 952 as a function of Rotator codes (x-axis) relative to the storage of first order difference Trim codes storage (y-axis) 954 as a function of the Rotator codes. The plots 952, 954 depict efficient trim code storage by storing the first order difference of trim codes as depicted. It can be seen from FIG. 16 that by storing the first order differences, the dynamic range of trim codes (other than the trim_code0) can be reduced from 6 bits to 5 bits. This results in an overall saving of 63 registers.

Another way to do efficient storage of calibration codes is by using multiple actuators for the correction of INL errors. For this, there is needed to calculate the INL of the rotator using the self calibration codes. This is possible since the self calibration is actually measuring the phase position impairments. From the INL data, one can always estimate the amount of IQ separation/DCD (Duty Cycle Distortion) errors present in the input IQ clocks going into the mixer. Using this information, these impairments can be corrected for separately. Now the trim codes needs to correct only the remaining random INL errors. This means the trim codes now have much lesser span.

In sum, a method for calibrating the Phase Interpolator is provided and the required hardware (circuit) implementation. A calibration procedure actually measures the phase difference between two phase positions of the Phase Interpolator at its output and corrects for any errors by adjusting the DAC weights finely by a thermometric Trim DAC. The circuit architecture comprises of an XOR phase detector, charge-pump integrator and comparator for measurement and correction of the INL errors suitable for calibration of high speed phase interpolators.

The system and method sets phase control (Rotator) codes to (in-phase) I and (quadrature) Q rotators to a first code pair, different by enough to produce a phase difference between the rotator outputs sufficient to be detected with minimal error by a phase-to-voltage converter. Auxiliary trim DACs are then adjusted according to applied calibration logic until a comparator output detects a phase difference between the I and Q rotators are within tolerable limits. The resulting trim codes are stored for both the codes in the pair. These trim codes along with the main codes are subsequently applied whenever the codes are used thereafter. These steps are repeated with each successive code pair having the same separation as the first code pair, e.g. both incremented by same amount until all codes have been calibrated. In this manner having the phase separation between all code pairs forced to the same value.

A method for self calibration of the calibration hardware is also presented which can be used to measure and cancel any offset errors existing in the calibration apparatus. The self calibration procedure, along with required hardware modifications, is configured to measure and correct any offset errors present in the calibration apparatus. The methods herein are extended to a real-time calibration scheme, which would also track against temperature and supply voltage drifts in a dynamic fashion. An efficient method of storing the calibration codes as their first order differences is also provided that results in considerable amount of saving in the storage of calibration trim codes.

As will be appreciated by one skilled in the art, aspects of the present disclosure may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system."

Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Referring now to FIG. 4, the flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions While the invention has been particularly shown and described with respect to illustrative and preformed embodiments thereof, it will be understood by those skilled in the art that the foregoing and other changes in form and details may be made therein without departing from the spirit and scope of the invention which should be limited only by the scope of the appended claims.

What is claimed is:

1. A calibration apparatus for a phase interpolator (PI), the interpolator having:
    a first phase addition mixer and a second phase addition mixer, the first phase addition mixer generating a first adjusted phase interpolated clock signal representing a first phase position of the phase interpolator according to a first bias current applied to said first phase addition mixer in response to a received first digital code value, and the second phase addition mixer generating a second adjusted phase interpolated clock signal representing a second phase position of the phase interpolator offset from said first phase position according to a second bias current applied to said second phase addition mixer in response to a received second digital code value, said apparatus comprising:
    a phase detector for receiving said respective first adjusted phase interpolated clock signal, and a respective second adjusted phase interpolated clock signal and generating a difference signal according to a detected phase error difference;
    a charge pump integrator circuit for receiving said difference signal and generating an output voltage ramp signal having a slope proportional to said detected phase error difference;
    and a comparator device receiving said output ramp signal and comparing output voltage ramp signal against a predetermined threshold, said comparator generating an output signal responsive to said comparison, said output signal representing a direction for adjustment of either said first clock phase or said second offset clock phase, or both to correct a detected phase error; and
    a logic circuit receiving said output signal and applying logic for one of: determining a first calibration code value for adjusting the first bias current applied to said first phase addition mixer, determining a second calibration code value for adjusting the second bias current applied to said second phase addition mixer to achieve a desired phase offset between said first and second clock signals that is within a predefined upper and lower threshold limit, or both determining a first calibration code value for adjusting the first bias current applied to said first phase addition mixer and determining a second calibration code value for adjusting the second bias current applied to said second phase addition mixer to achieve the desired phase offset,
    each said determined first calibration code value and second calibration code value for correcting a non-linearity error of a phase position at an output of the phase interpolator with respect to a respective received first digital code value or received second digital code value.

2. The calibration apparatus as claimed in claim 1, wherein said first phase addition mixer generates said first clock signal of a first phase according to said first bias current applied to said first mixer according to weights of a first digital to analog converter (first DAC) responsive to said received first digital code value, and the second phase addition mixer generates a second clock signal of a second phase offset from said first phase according to said second bias current applied to said second mixer according to weights of a second digital to analog converter (second DAC) responsive to said received second digital code value, said apparatus further comprising:
    a first trim DAC responsive to said first calibration code value for trimming said weights of said first DAC, and, a second trim DAC responsive to said second calibration code value for trimming said weights of said second DAC, wherein trimming either or both said first DAC and second DAC corrects said phase error difference.

3. The calibration apparatus as claimed in claim 2, wherein said PI is configurable to provide a plurality of combinations of the first clock signal of a first phase and the second clock signal of the phase offset therefrom to achieve a desired phase adjustment therebetween, said apparatus configured to obtain, for each one of said plurality of combinations in successive calibration steps, the first calibration code value configured for adjusting the first bias current applied to said first phase addition mixer, and the second calibration code value configured for adjusting a second bias current applied to said second phase addition mixer, said apparatus further comprising:

a memory storage device for storing and accessing said first calibration code value and said second calibration code value for each said combination of said plurality, wherein said PI apparatus subsequently uses said stored first calibration code value and said second calibration code value for correcting said non-linearity error of the phase position at the output of the phase interpolator with respect to the received digital code value.

4. The apparatus as claimed in claim 3, wherein said PI is configurable to provide up to 64 combinations of first clock and second phase offset clock signals to provide up to 64 output clock phase adjustments based on corresponding combinations of received first and second digital code values.

5. The apparatus as claimed in claim 3 wherein a combination of a received first digital code value and second digital code value is set at a fixed offset relative to each other to generate a respective first clock signal and second offset clock signal at a particular calibration step, wherein said phase detector comprises an XOR phase detector for XOR-ing said first clock and second offset clock signals to produce pulses having widths proportional to the phase difference between said first and second clocks, said produced pulses operating to activate a switch in said charge pump integrator circuit.

6. The apparatus as claimed in claim 5 wherein said charge pump integrator circuit produces a differential voltage output at a respective first and second output node thereof that is proportional to said detected phase error difference.

7. The apparatus as claimed in claim 6 wherein said comparator device is a voltage comparator of a differential configuration having a first upper threshold and a second lower threshold, a voltage between said first and second thresholds defining an acceptable phase difference, said differential comparator device:

receiving said differential voltage output and comparing said differential voltage output against both said first upper threshold and against said second pre-determined threshold in a single phase comparison cycle, and generating said output signal representing said phase adjustment direction of a phase of said first clock or second clock when said output differential voltage is above said first upper threshold or below said second lower threshold in said single phase comparison cycle.

8. The apparatus as claimed in claim 7 wherein said logic circuit performs at each successive calibration step, a trimming procedure to obtain said first calibration code and second calibration code values, said trimming procedure alternating said determining of said first calibration code value and the determining of said second calibration code values.

9. The apparatus as claimed in claim 8 wherein said logic circuit performs during said trimming procedure, alternately one of: incrementing or decrementing either the first calibration code value or the second calibration code value according to a fixed offset code value.

10. The apparatus as claimed in claim 4, further comprising:

obtaining an optimum code_offset value between the first digital code value input to said first mixer and second digital code value input to said second mixer during calibration so as to satisfy a condition of: a 'remainder (total_rotator_steps/code_offset)=1' where a total_rotator_steps corresponds to a total number of combinations of output clock phase adjustments of said PI.

11. A method of calibrating a phase interpolator (PI), the PI having:

a first phase addition mixer and a second phase addition mixer, the first phase addition mixer generating a first adjusted phase interpolated clock signal representing a first phase position of the phase interpolator according to a first bias current applied to said first phase addition mixer in response to a received first digital code value, and the second phase addition mixer generating a second adjusted phase interpolated clock signal representing a second phase position of the phase interpolator offset from said first phase position according to a second bias current applied to said second phase addition mixer in response to a received second digital code value, said method comprising:

receiving, at a phase detector, said first adjusted phase interpolated clock signal and said second adjusted phase interpolated clock signal, and detecting a phase error difference between said first adjusted phase interpolated and second adjusted phase interpolated clock signals;

generating a difference signal according to said detected phase error difference;

generating, at a charge pump integrator circuit, an output ramp signal having a slope proportional to said detected phase error difference;

comparing, at a comparator device, said output ramp signal against a predetermined threshold, and generating an output signal responsive to said comparison, said output signal representing a direction for adjustment of either said first clock phase or said second offset clock phase, or both;

receiving, at a logic circuit, said output signal and applying logic to one of: determine a first calibration code value for adjusting the first bias current applied to said first phase addition mixer, determine a second calibration code value for adjusting the second bias current applied to said second phase addition mixer to achieve a desired phase offset between said first and second clock signals, or determine both a first calibration code value for adjusting the first bias current applied to said first phase addition mixer and a second calibration code value for adjusting the second bias current applied to said second phase addition mixer to achieve the desired phase offset; and applying said adjusting first bias current and adjusting second bias current to said respective first mixer and second mixer to achieve a desired phase offset between said first and second clock signals that is within a predefined upper and lower threshold limit, each said determined first calibration code value and second calibration code value for correcting a non-linearity error of a phase position at an output of the phase interpolator with respect to a respective received said first digital code value or received said second digital code value.

12. The method as claimed in claim 11, wherein said first phase addition mixer generates said first clock signal of a first phase according to said first bias current applied to said first mixer according to weights of a first digital to analog converter (first DAC) responsive to said received first digital code value, and the second phase addition mixer generates a second clock signal of a second phase offset from said first phase according to said second bias current applied to said second mixer according to weights of a second digital to analog converter (second DAC) responsive to said received second digital code value, said applying said adjusting first bias current and second bias currents comprising:
   trimming said weights of said first DAC responsive to said first calibration code value to adjust said bias current applied to said first mixer, and trimming said weights of said second DAC responsive to said second calibration code value to adjust said bias current applied to said second mixer, or both, wherein trimming either or both said first DAC and second DAC corrects said phase error difference.

13. The method as claimed in claim 12, wherein said PI is configurable to provide a plurality of combinations of the first clock signal of the first phase and the second clock signal of the phase offset therefrom to achieve a desired phase adjustment therebetween, said method further comprising:
   obtaining, for each one of said plurality of combinations in successive calibration steps, the first calibration code value configured for adjusting the first bias current applied to said first phase addition mixer, and the second calibration code value configured for adjusting the second bias current applied to said second phase addition mixer, and
   storing, in a memory storage device, said first calibration code value and said second calibration code value for each said combination of said plurality,
   wherein said stored first calibration code value and said second calibration code value are subsequently used for correcting the non-linearity error of the phase position at the output of the phase interpolator with respect to a received digital code value.

14. The method as claimed in claim 13, wherein said PI is configurable to provide up to 64 combinations of first clock and second phase offset clock signals to provide up to 64 output clock phase adjustments based on corresponding combinations of received first and second digital code values.

15. The method as claimed in claim 14 further comprising; producing, at said charge pump integrator circuit, a differential voltage output at a respective first and second output node thereof that is proportional to said detected phase error difference.

16. The method as claimed in claim 15 wherein said comparator device is a voltage comparator of a differential configuration having a first upper threshold and a second lower threshold, wherein a voltage between said first and second thresholds defines an acceptable phase difference said differential comparator device, said method comprising:
   receiving at said differential comparator device, said differential voltage output,
   comparing said differential voltage output against both said first upper threshold and against said second pre-determined threshold in a single phase comparison cycle, and
   generating said output signal representing said phase adjustment direction of a phase of said first clock or second clock when said output differential voltage is above said first upper threshold or below said second lower threshold in said single phase comparison cycle.

17. The method as claimed in claim 16 further comprising:
   performing at said logic circuit, at each successive calibration step, a trimming procedure to obtain said first calibration code and second calibration code values, said trimming procedure alternating said determining of said first calibration code value and the determining of said second calibration code values.

18. The method as claimed in claim 17 wherein during said trimming procedure, alternately one of: incrementing or decrementing either the first calibration code value or the second calibration code value according to a fixed offset code value.

19. The method as claimed in claim 12 further comprising:
   obtaining an optimum code_offset value between the first digital code value input to said first mixer and second digital code value input to said second mixer during calibration so as to satisfy a condition of: a 'remainder (total_rotator_steps/code_offset)=1' where a total_rotator_steps corresponds to a total number of combinations of output clock phase adjustments of said PI.

20. The method as claimed in claim 15, wherein said charge pump employs a first current source providing (I_UP) first current switched under control of said produced pulses to generate a second current (I_DOWN) at each of a first path and second path forming a respective output of said differential outputs, said charge pump employing one or more trim current sources I_DOWN_TRIM for adjusting a current ratio of I_UP/I_DOWN, wherein prior to calibrating said PI, performing a self-calibrating procedure comprising:
   fixing a code offset between each phase clock setting at each said first and second mixer device;
   measuring the offset, said offset a fraction of a rotator LSB, using said phase phase detector and generating at said charge pump integrator circuit a corresponding differential voltage output,
   wherein responsive to said generated differential voltage output being above said first upper threshold said generated output signal represents a first phase adjustment direction of a phase of a first clock or second clock; or
   responsive to said generated differential voltage output being below said second lower threshold in said single phase comparison cycle said generated output signal represents a second phase adjustment direction of a phase of a first clock or second clock;
   otherwise,
   storing the I_DOWN1_trim and I_DOWN2_trim values obtained into a memory storage device;
   and repeating said phase detecting measurements for each successive pairs of pairs of codes of a phase interpolator phase constellation to obtain successive pairs of I_DOWN1_trim and I_DOWN2_trim values for all the pairs of codes of said constellation;
   averaging each respective pair of I_DOWN1_trim and I_DOWN2_trim across all the codes of said phase constellation, and storing each respective pair of I_DOWN1_trim_avg and I_DOWN2_trim_avg values for each respective code pair, wherein the charge pump ratio of said currents I_UP/I_DOWN are adjusted during self-calibration procedure to correct said phase offset inherent in said calibration apparatus.

21. The method as claimed in claim 20, wherein the first phase adjustment direction of the phase of the first clock or second clock comprises:
increasing a trim current (I_DOWN1_trim) value applied by a first I_DOWN trim current source applied to a I_DOWN 1 current at said first path, and
decreasing a trim current (I_DOWN2_trim) value applied by a second I_DOWN trim current source applied to a I_DOWN2 current at said second path of said differential charge pump outputs; and wherein the first second phase adjustment direction of the phase of the first clock or second clock comprises:
decreasing a trim current (I_DOWN1_trim) value applied by a first I_DOWN trim current source applied to a I_DOWN 1 current at said first path, and
increasing a trim current (I_DOWN2_trim) value applied by a second I_DOWN trim current source applied to a I_DOWN2 current at said second path of said differential charge pump outputs.

22. The method as claimed in claim 20, further comprising:
correcting said phase offset inherent in said calibration apparatus by adjusting a charge pump ratio of said currents I_UP/I_DOWN during self-calibration procedure by injecting current to modify the I_DOWN1 and I_DOWN2 values according to:

$$I\_DOWN1 = I\_DOWN1 - I\_DOWN1\_trim\_avg$$

$$I\_DOWN2 = I\_DOWN2 - I\_DOWN2\_trim\_avg$$

wherein said I_DOWN_trim_avg values are applied through the first I_DOWN trim and second I_DOWN trim current sources.

* * * * *